US012525484B2

(12) United States Patent
You et al.

(10) Patent No.: US 12,525,484 B2
(45) Date of Patent: Jan. 13, 2026

(54) INTERCONNECT STRUCTURE FOR MULTI-THICKNESS SEMICONDUCTOR DEVICE

(71) Applicant: Taiwan Semiconductor Manufacturing Company, Ltd., Hsinchu (TW)

(72) Inventors: Yao-Hong You, Yunlin County (TW); Dah-Chuen Ho, Zhubei (TW); Kuo-Ming Wu, Hsinchu (TW); Ying-De Chen, Fangliao Township (TW); Yi-Min Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 314 days.

(21) Appl. No.: 18/191,290

(22) Filed: Mar. 28, 2023

(65) Prior Publication Data

US 2024/0332065 A1 Oct. 3, 2024

(51) Int. Cl.
*H01L 21/768* (2006.01)
*H01L 23/522* (2006.01)
*H01L 23/528* (2006.01)
*H01L 23/532* (2006.01)

(52) U.S. Cl.
CPC .. *H01L 21/76816* (2013.01); *H01L 21/76877* (2013.01); *H01L 23/5226* (2013.01); *H01L 23/528* (2013.01); *H01L 23/53219* (2013.01); *H01L 23/53223* (2013.01); *H01L 23/53233* (2013.01); *H01L 23/53238* (2013.01); *H01L 23/53257* (2013.01)

(58) Field of Classification Search
CPC ......... H01L 21/76816; H01L 21/76877; H01L 21/76897; H01L 23/5226; H01L 23/528; H01L 23/53223; H01L 23/53233; H01L 23/53238; H01L 23/53257
See application file for complete search history.

(56) References Cited

U.S. PATENT DOCUMENTS

| 6,025,995 | A | * | 2/2000 | Marcinkiewicz | ....... | H01L 25/16 361/764 |
| 8,536,050 | B2 | * | 9/2013 | Frohberg | .......... | H01L 21/76816 438/723 |
| 8,680,404 | B2 | * | 3/2014 | Ryoichi | ................. | H05K 3/421 174/262 |
| 2017/0125340 | A1 | * | 5/2017 | Tsai | .................. | H01L 21/02178 |

* cited by examiner

*Primary Examiner* — Zandra V Smith
*Assistant Examiner* — John M Parker
(74) *Attorney, Agent, or Firm* — Eschweiler & Potashnik, LLC

(57) ABSTRACT

The present disclosure relates to a method of forming an interconnect structure that eliminates a separate deep via patterning process to simplify the fabrication process. In some embodiments, a first dielectric layer is formed over a first metal line and patterned to form a through-hole exposing a first contact region of the first metal line. A second dielectric layer is deposited and patterned to form a first via-hole connecting to the through-hole and a second via-hole exposing a second contact region of the second metal line from a layout view. A first via is formed on the first contact region extending to a first upper surface of the second dielectric layer, and a second via is formed on the second contact region extending to a second upper surface of the second dielectric layer.

20 Claims, 15 Drawing Sheets

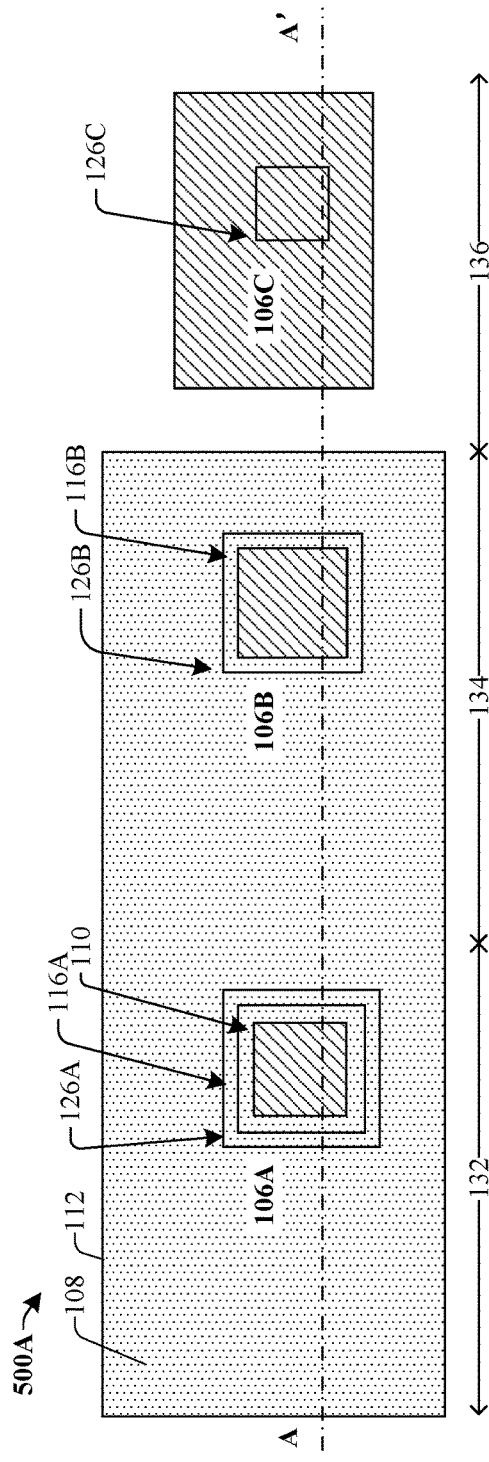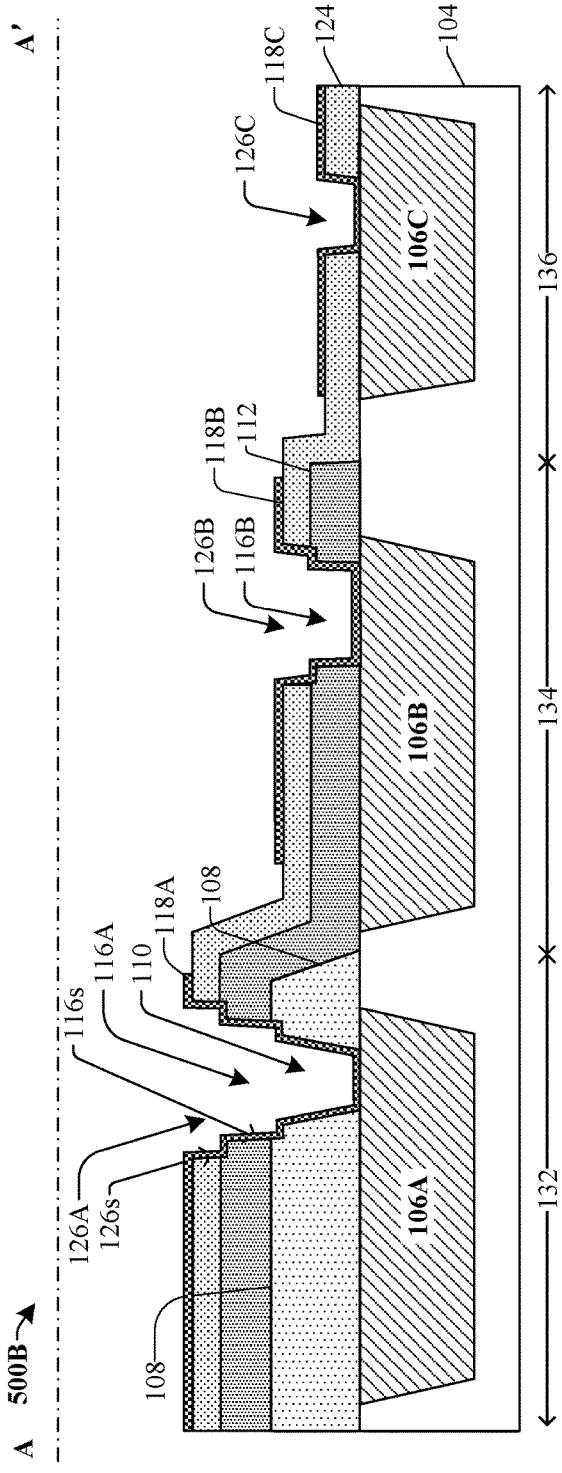
Fig. 5A
Fig. 5B

INTERCONNECT STRUCTURE FOR MULTI-THICKNESS SEMICONDUCTOR DEVICE

BACKGROUND

Interconnect structure includes conductive features that connect two or more circuit elements (such as transistors, power source, signal input, etc.) together electrically. Interconnect structure includes both on-chip interconnect of integrated circuits and off-chip interconnect in heterogeneous system integration. In interconnect design, geometric dimensions (width, thickness, spacing, aspect ratio, pitch), materials, process control and design layout are critical to proper interconnect function, performance, power efficiency, reliability, and fabrication yield.

BRIEF DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5B illustrate layout and cross-sectional views of some additional embodiments of an interconnect structure having multiple staggered vias with different heights.

DETAILED DESCRIPTION

Figure 1A:
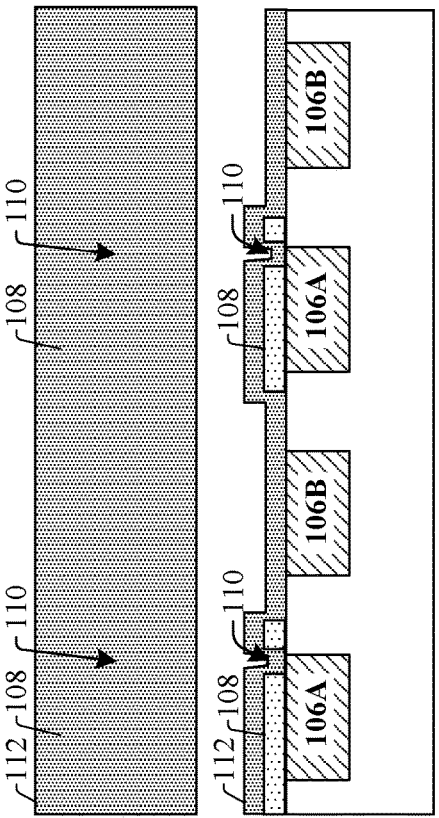
FIGS. 1A-1D illustrate a series of layout and cross-sectional views of some embodiments of a method for forming an interconnect structure having a staggered via formed by a two-step process.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples for similar features. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fabricating semiconductor devices involves depositing and patterning various materials such as semiconductor, dielectric, and metal to form circuit elements. The circuit elements then need to be electrically connected to function properly. An interconnect structure includes conductive features that connect two or more circuit elements (such as transistors, power source, signal input, etc.) together. Interconnect structure can be either an on-chip interconnect of integrated circuits or off-chip interconnect in heterogeneous system integration. In interconnect design, geometric dimensions (width, thickness, spacing, aspect ratio, pitch), materials, process control and design layout are critical to proper interconnect function, performance, power efficiency, reliability, and fabrication yield.

In some applications, a semiconductor device has a non-uniform thickness, or multiple semiconductor devices with different thicknesses are integrated on one substrate. For example, MEMS devices may comprise gaps with multiple heights; acoustic devices may require different distances from respective flexible and fixed plates, or optical devices may have cavities of different lengths. One way of forming a multi-thickness structure is to form and pattern a first dielectric layer on a first region requiring a greater thickness followed by forming a second dielectric layer globally. Still, it could be challenging to form the interconnect structure to connect a metal line from bottom to top of the multi-thickness structure. Deeper vias may result in a less reliable connection and greater contact resistance with underlying metal. Also, a separate masking and patterning process may be needed to form the deeper vias in order to reduce over-etching damage to other via regions with a smaller dimension.

Accordingly, some embodiments of the present disclosure relates to a new method to form an interconnect structure for multi-thickness semiconductor device, and the associated interconnect structure. In the method, a first via may be formed by a two-step process, where a lower portion of the first via is formed when patterning a first dielectric layer for raising height in a first region, and an upper portion of the first via is subsequently formed by forming and patterning a second dielectric layer overlying the patterned first dielectric layer and concurrently forming a second via in a second region absenting the first dielectric layer. Thus, no additional patterning process is needed for forming the first via and the second via with different thicknesses. In some embodiments, the first via is formed with a bottom lateral dimension of the upper portion greater than a top lateral dimension of the lower portion, and therefore results in a staggered via shape with a ledge between the upper portion and the lower portion. Since the step height for filling the first via is reduced by having the staggered via shape with a ledge in the middle, reliability and contact resistance of the first via can be improved.

FIGS. 1A-1D illustrate a series of layout and cross-sectional views of some embodiments of a method for forming an interconnect structure having a staggered via formed by a two-step process. Although FIGS. 1A-1D are described in relation to a method, it will be appreciated that the structures disclosed in FIGS. 1A-1D are not limited to such a method, but instead may stand alone as structures independent of the method.

As shown in the layout and cross-sectional views of FIG. 1A, a first metal line 106A and a second metal line 106B are provided. In some embodiments, the first metal line 106A and the second metal line 106B may be arranged one next to another and may be arranged repeatedly in arrays. To form a greater height above the first metal line 106A, in some embodiments, a first dielectric layer 108 is firstly deposited over the first metal line 106A and the second metal line 106B and then patterned to be removed from the second metal line 106B. A through-hole 110 is formed from the patterning process exposing a first contact region of the first metal line 106A. In some embodiments, the through-hole 110 may have a square shape as shown, or another polygon or circle shape alternatively, from the layout view. The through-hole 110 may be arranged at one or more various locations above the first metal line 106A, such as a boundary region of the first metal line 106A as shown in FIGS. 1A-1D. In some alternative embodiments, the through-hole 110 may be arranged at one or more of a central region, a corner region, or other applicable locations.

Figure 1B:
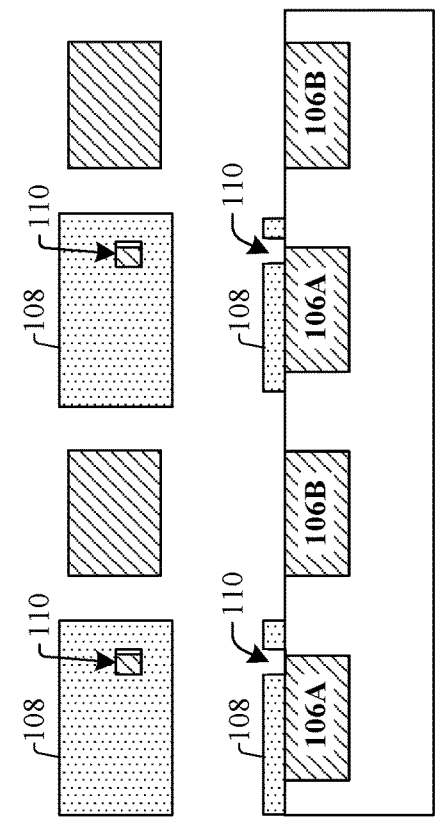

As shown in the layout and cross-sectional views of FIG. 1B, a second dielectric layer 112 is formed over the first dielectric layer 108 overlying the first metal line 106A and also overlying the second metal line 106B absenting the first dielectric layer 108. Thus, the first dielectric layer 108 and the second dielectric layer 112 collectively build a greater height directly above the first metal line 106A than a height directly above the second metal line 106B. The second dielectric layer 112 may extend into the through-hole 110 reaching the first contact region of the first metal line 106A. In some embodiments, the second dielectric layer 112 may be deposited globally. In some alternative embodiments, the second dielectric layer 112 may also be patterned but still left to cover at least portions of the first dielectric layer 108 and the second dielectric layer 112.

Figure 1C:
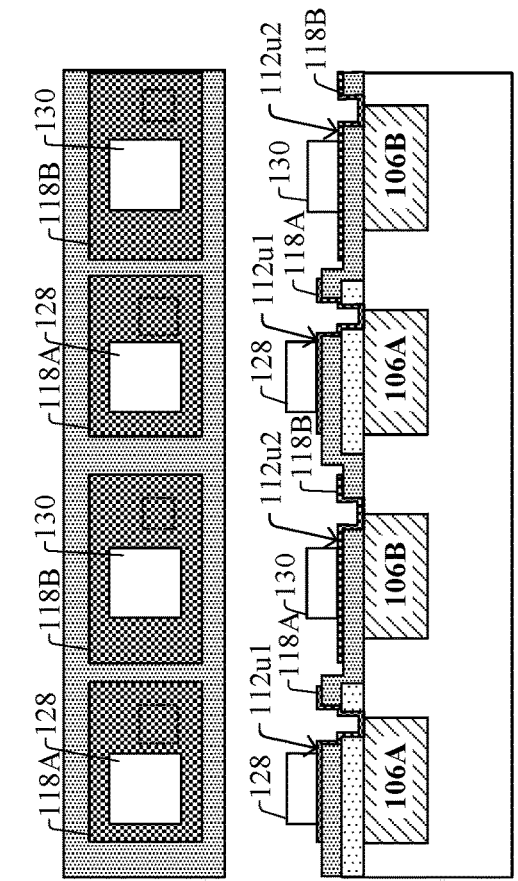
Figure 1D:
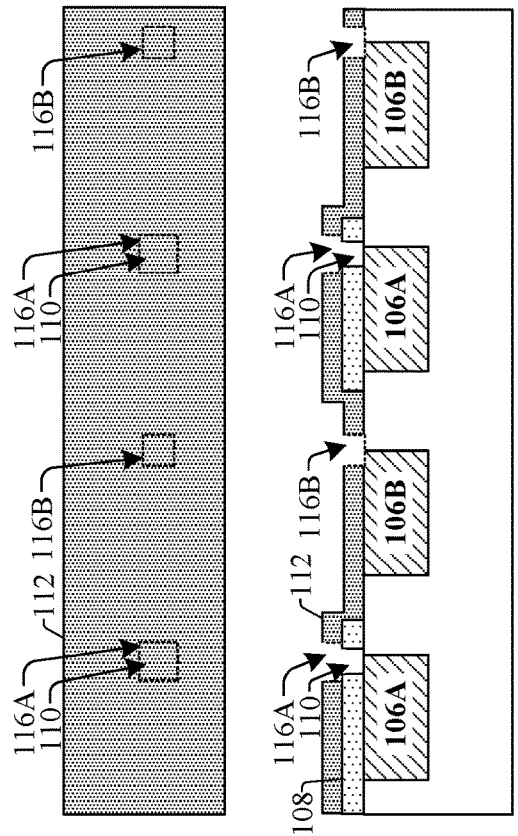

As shown in the layout and cross-sectional views of FIG. 1C, the second dielectric layer 112 is then patterned to concurrently form a first via-hole 116A directly above the lower through-hole 110 and a second via-hole 116B exposing a second contact region of the second metal line 106B. The through-hole 110 and the first via-hole 116A collectively form a via-hole for a first via 118A (see FIG. 1D). The second via-hole is for a second via 118B (see FIG. 1D) with a depth smaller than the first via 118A. In some embodiments, the first via-hole 116A or the second via-hole 116B may have a square shape as shown, or another polygon or circle shape alternatively, from the layout view. The first via-hole 116A may be arranged concentric with the through-hole 110. In some embodiments, a bottom lateral dimension of the first via-hole 116A is greater than a top lateral dimension of the through-hole 110, and therefore results in a staggered shape with a ledge between the first via-hole 116A and the through-hole 110. The second via-hole 116B may be arranged at one or more various locations above the second metal line 106B, such as a boundary region as shown in FIGS. 1C-1D. In some alternative embodiments, the second via-hole 116B may be arranged at one or more of a central region, a side region within the boundary of the second metal line 106B, a corner region, or other applicable locations, as discussed in more detail later on. In some embodiments, the second via-hole 116B may have a top or bottom lateral dimension, such as a diameter or a side length, that is between those of the first via-hole 116A and the through-hole 110.

As shown in the layout and cross-sectional views of FIG. 1D, the first via 118A and the second via 118B are respectively formed within the first via-hole 116A and the through-hole 110 and the second via-hole 116B. In some embodiments, the first via 118A extends along a first upper surface 112u1 of the second dielectric layer 112, and the second via 118B extends along a second upper surface 112u2 of the second dielectric layer 112. A first device 128 may be formed on the first via 118A above the first upper surface 112u1 and electrically connected to the first metal line 106A. Similarly, a second device 130 may be formed on the second via 118B above the second upper surface 112u2 and electrically connected to the second metal line 106B. As an example, control signals may be provided from a logic circuit to the first device 128 and the second device 130 respectively through the first metal line 106A and the second metal line 106B. A first vertical distance from a bottom surface of the first device 128 to the first metal line 106A is greater than a second vertical distance from a bottom surface of the second device 130 to the second metal line 106B.

By forming the through-hole 110 when patterning the first dielectric layer 108 and then forming the first via-hole 116A and the second via-hole 116B together by patterning the second dielectric layer 112, no additional patterning process is needed for patterning the first via 118A and the second via 118B with different thicknesses. In addition, since the step height for filling the first via 118A is reduced by having the staggered via shape with a ledge in the middle, reliability and contact resistance of the first via 118A are improved.

Figure 2:
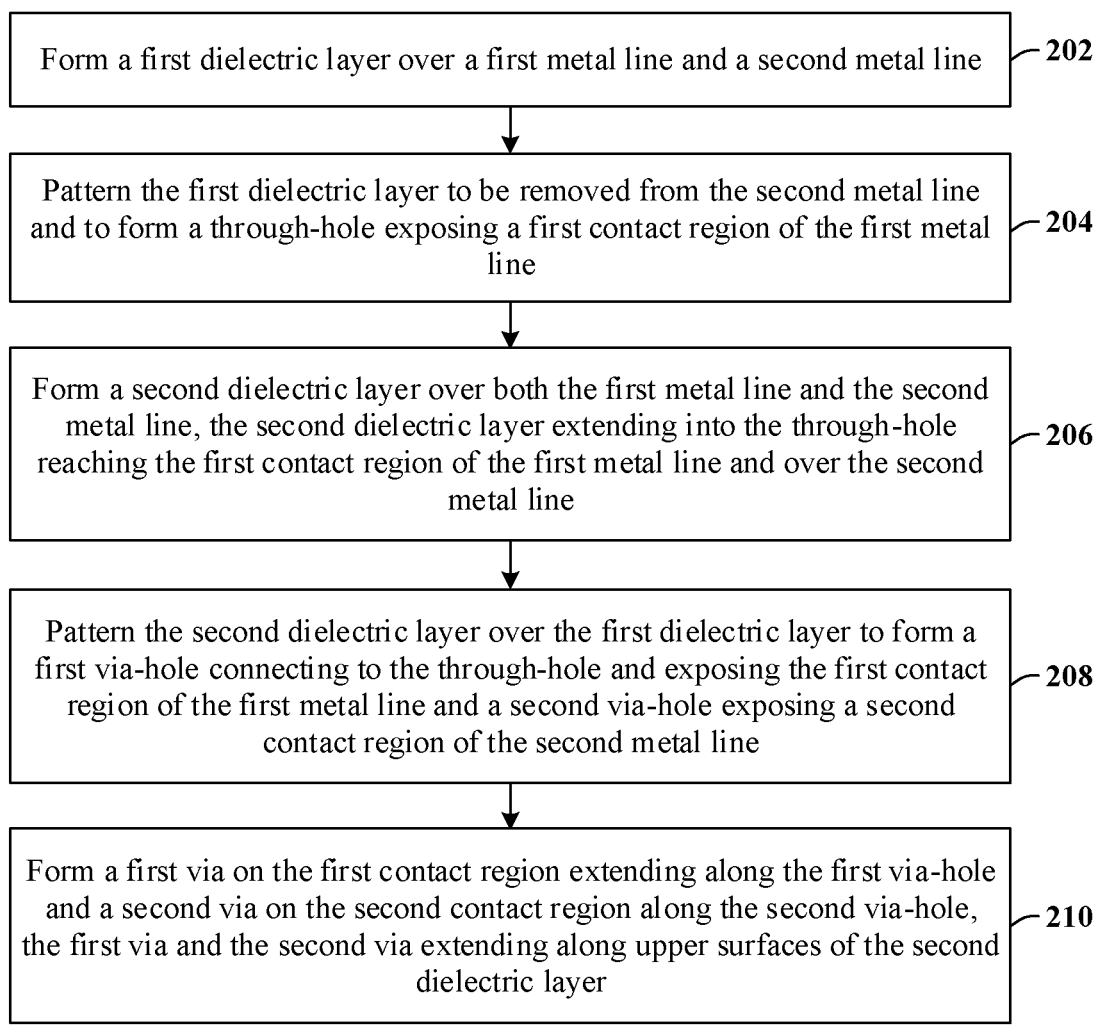
FIG. 2 illustrates a process flow diagram of some embodiments of a method for forming an interconnect structure having a staggered via formed by a two-step process.

FIG. 2 illustrates a process flow diagram of some embodiments of a method for forming an interconnect structure having a staggered via formed by a two-step process. While method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 7A:
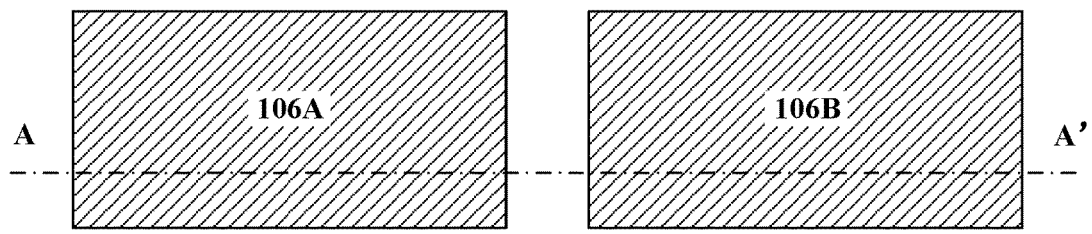
FIGS. 7A-11B illustrate a series of layout and cross-sectional views of some embodiments of a method for forming an interconnect structure having a staggered via formed by a two-step process.
Figure 7B:
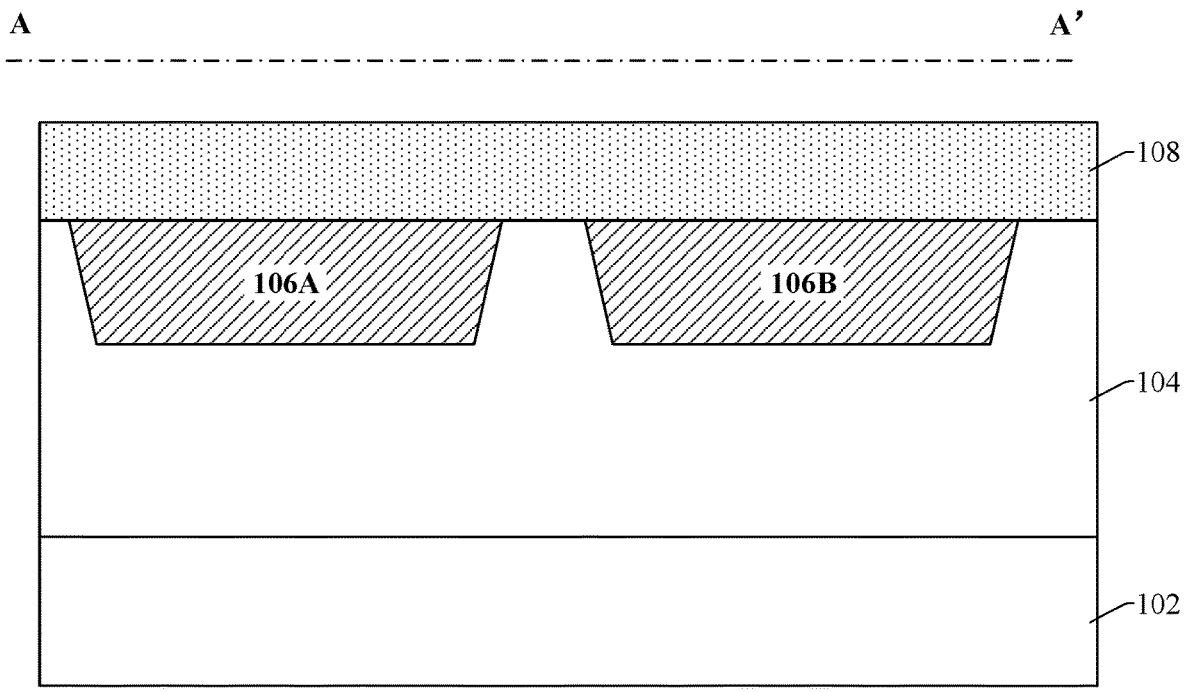

At act 202, in some embodiments, a first metal line and a second metal line are provided overlying a substrate. A first dielectric layer is formed over the first metal line and the second metal line. FIGS. 7A-7B illustrate some examples corresponding to act 202.

At act 204, in some embodiments, the first dielectric layer is patterned overlying the first metal line and absent from the second metal line. A lower through-hole is patterned in a first region when patterning the first dielectric layer overlying the first metal line. FIGS. 1A, 8A-8B, and 12A-12B illustrate some examples corresponding to act 204.

At act 206, an second dielectric layer is formed over the first dielectric layer in the first region and also overlying a second metal line in a second region absenting the first dielectric layer. The second dielectric layer may extend into the through-hole reaching a first contact region of the first metal line. The second dielectric layer may be formed directly on the second metal line. FIGS. 1B, 9A-9B, and 13A-13B illustrate some examples corresponding to act 206.

At act 208, the second dielectric layer is then patterned to concurrently form a first via-hole directly above the lower through-hole in the first region and a second via-hole in the second region. As a result, the lower through-hole and the first via-hole collectively form a via-hole exposing a first contact region for the first via, and the second via-hole exposes a second contact region for a second via with a depth smaller than the first via. FIGS. 1C, 10A-10B, and 14A-14B illustrate some examples corresponding to act 208.

At act 210, a first via is formed on the first contact region extending along the first via-hole, and a second via is formed on the second contact region along the second via-hole. The first via and the second via may respectively extend along a first upper surface and a second upper surface of the second dielectric layer. FIGS. 1D, 11A-11B, and 15A-15B illustrate some examples corresponding to act 210.

Figure 3A:
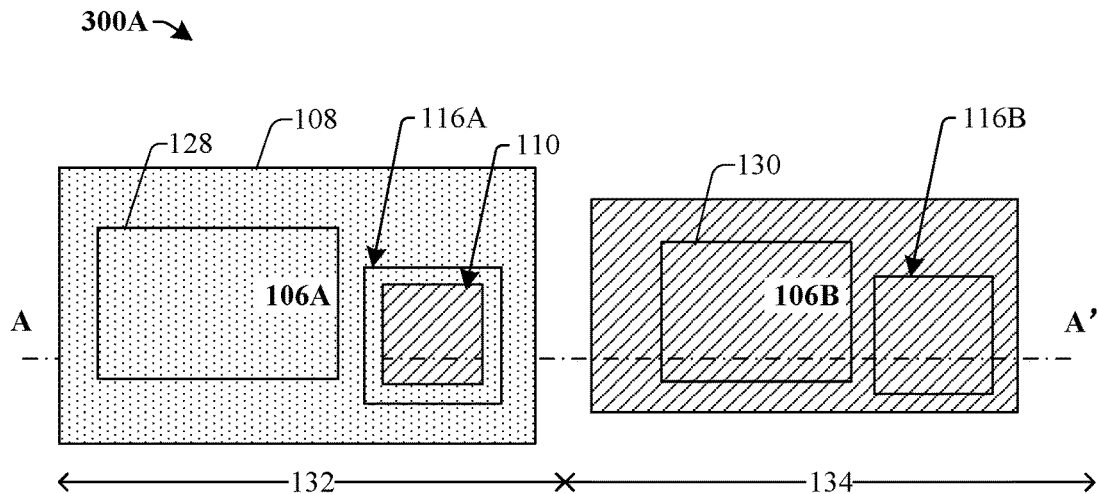
FIGS. 3A-3B illustrate layout and cross-sectional views of some embodiments of an interconnect structure having a staggered via.
Figure 3B:
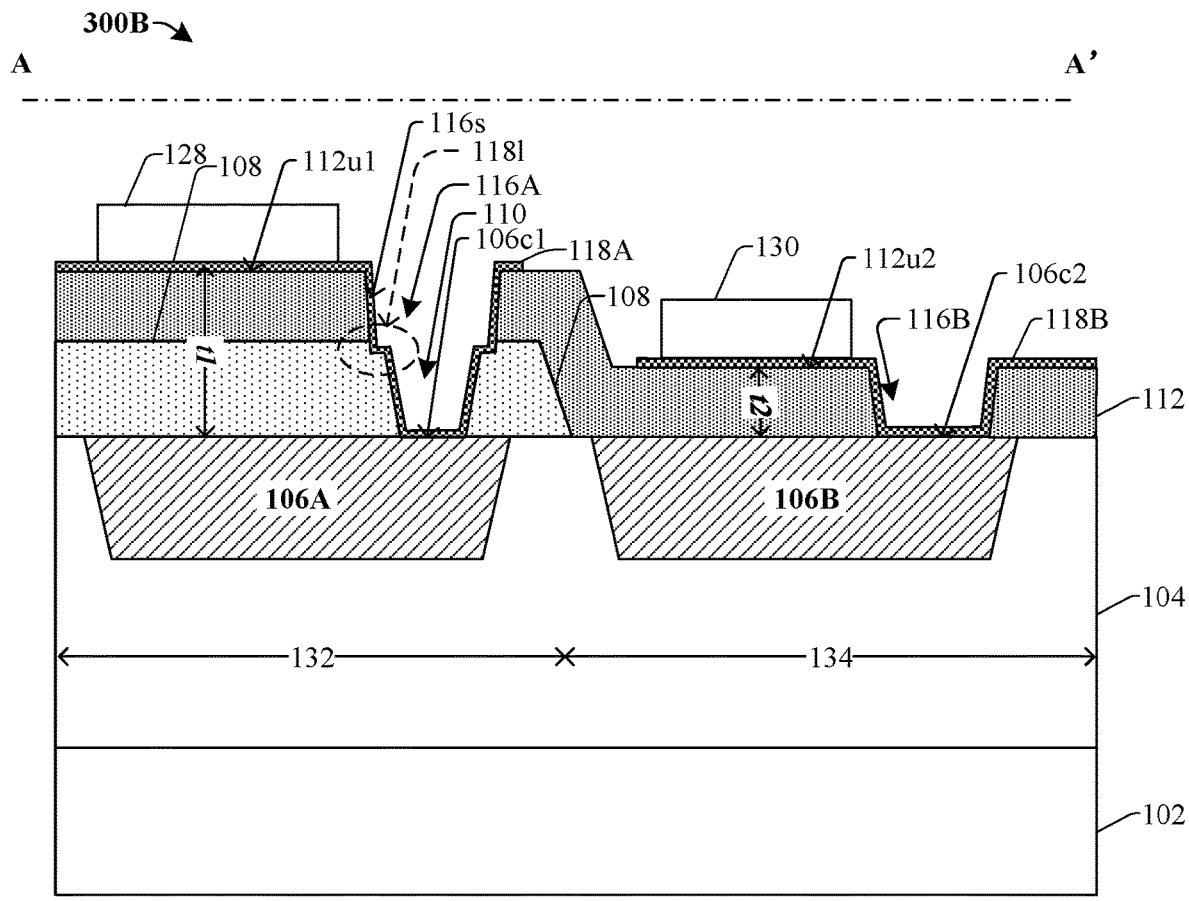

FIGS. 3A-3B illustrate a layout view 300A and a cross-sectional view 300B of some embodiments of an interconnect structure having a first via 118A disposed in a first region 132 and a second via 118B disposed in a second region 134. The first via 118A may be a staggered via disposed on a first contact region 106c1 of a first metal line 106A, and the second via 118B may be disposed on a second contact region 106c2 of a second metal line 106B.

The first metal line 106A and the second metal line 106B may be surrounded by an adjoining dielectric 104 and disposed over a substrate 102. In some embodiments, the first metal line 106A and the second metal line 106B are respectively connected to semiconductor devices (not shown) disposed within the substrate 102 through one or more additional interconnect features including metal lines and vias. As an example, the first metal line 106A and the second metal line 106B may be connected to logic circuit within the substrate 102 to respectively transmit control signals to a first device 128 and a second device 130.

In some embodiments, a first dielectric layer 108 is disposed over the first metal line 106A. A through-hole 110 extends through the first dielectric layer 108 and overlies the first contact region 106c1 of the first metal line 106A. A second dielectric layer 112 may be disposed over the first dielectric layer 108 and the first and second metal lines 106A, 106B. A first via-hole 116A and a second via-hole 116B extend through the second dielectric layer 112. The first via-hole 116A connects to the through-hole 110 and overlies the first contact region 106c1. The second via-hole 116B overlies the second contact region 106c2 of the second metal line 106B. The first via 118A extends along the through-hole 110, the first via-hole 116A, and a first upper surface 112u1 of the second dielectric layer 112. The second via 118B extends along the second via-hole 116B and a second upper surface 112u2 of the second dielectric layer 112.

In some embodiments, the first via-hole 116A has a bottom lateral dimension greater than a top lateral dimension of the through-hole 110. The first via 118A may comprise a ledge 118l lining an upper surface of the first dielectric layer 108 and connecting sidewalls of the first dielectric layer 108 and the second dielectric layer 112. In some embodiments, the first via-hole 116A has the entire sidewall 116s smoothly extending from the second dielectric layer 112 to the first dielectric layer 108.

The first device 128 may be disposed on a first lateral portion of the first via 118A and electrically connected to the first metal line 106A by the first via 118A. Similarly, the second device 130 may be disposed on a second lateral portion of the second via 118B and electrically connected to the second metal line 106B by the second via 118B. A first vertical distance t1 from a bottom surface of the first device 128 to the first metal line 106A is greater than a second vertical distance t2 from a bottom surface of the second device 130 to the second metal line 106B, and thus may provide gaps or cavities of different lengths between the first metal line 106A and the first device 128 and between the second metal line 106B and the second device 130.

Referring to FIG. 3A for the layout view, in some embodiments, the second via-hole 116B has a square shape with a side length between a side length of the through-hole 110 and a side length of the first via-hole 116A. The through-hole 110 and the first via-hole 116A may both be a square shape as well. In some alternative embodiments, the through-hole 110, the first via-hole 116A, or the second via-hole 116B may have another polygon or circle shape. The first via-hole 116A may be arranged concentric with the through-hole 110. As an example, the through-hole 110 may have a side length of from about 50 nm to about 300 nm, the the first via-hole 116A may have a side length of from about 300 nm to about 1000 nm, while the second via-hole 116B may have a side length of from about 200 nm to about 500 nm. In some embodiments, the second via-hole 116B may have a top or bottom lateral dimension, such as a diameter or a side length, that is between those of the first via-hole 116A and the through-hole 110. The first via-hole 116A may have a lateral dimension shifted a constant value from that of the first via-hole 116A. By setting the layout shapes and dimensions as discussed above, the maximum use of layout areas is achieved while providing sufficient contact areas and ledges for better via fillings.

In various embodiments, the substrate 102 may comprise any type of semiconductor body (e.g., silicon/CMOS bulk, SiGe, etc.) such as a semiconductor wafer or one or more die on a wafer, as well as any other type of semiconductor and/or epitaxial layers formed thereon and/or otherwise associated therewith. The adjoining dielectric 104 may comprise silicon dioxide and/or other low-k dielectric material, for example. The first metal line 106A and the second metal line 106B may comprise conductive materials, such as aluminum (Al), copper (Cu), titanium nitride (e.g., TiN), tantalum nitride (e.g., TaN), platinum (e.g., Pt), titanium (e.g., Ti), tantalum (e.g., Ta) tungsten (e.g., W), iron (e.g., Fe), nickel (e.g., Ni), some other suitable metal(s), or any alloy or combination of the foregoing. For example, the first metal line 106A and the second metal line 106B respectively has a thickness of about 15 nanometers, about 15-500 nanometers, or some other suitable thickness. The first dielectric layer 108 or the second dielectric layer 112 may comprise a dielectric material such as silicon dioxide, silicon nitride, and/or alumina for example. The first via 118A and the second via 118B may comprise TiN or other suitable conductive materials.

Figure 4A:
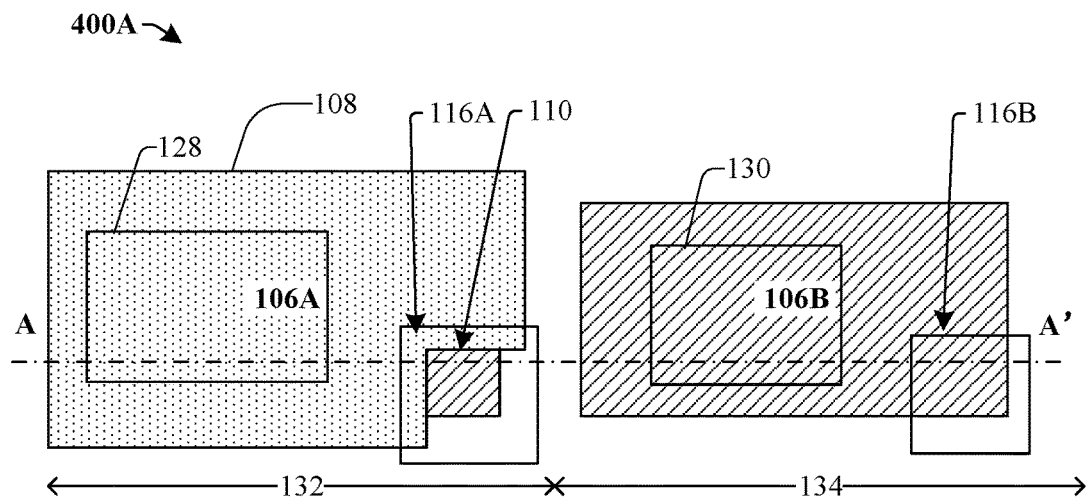
FIGS. 4A-4B illustrate layout and cross-sectional views of some additional embodiments of an interconnect structure having a staggered via disposed on a boundary region of an underlying metal line.
Figure 4B:
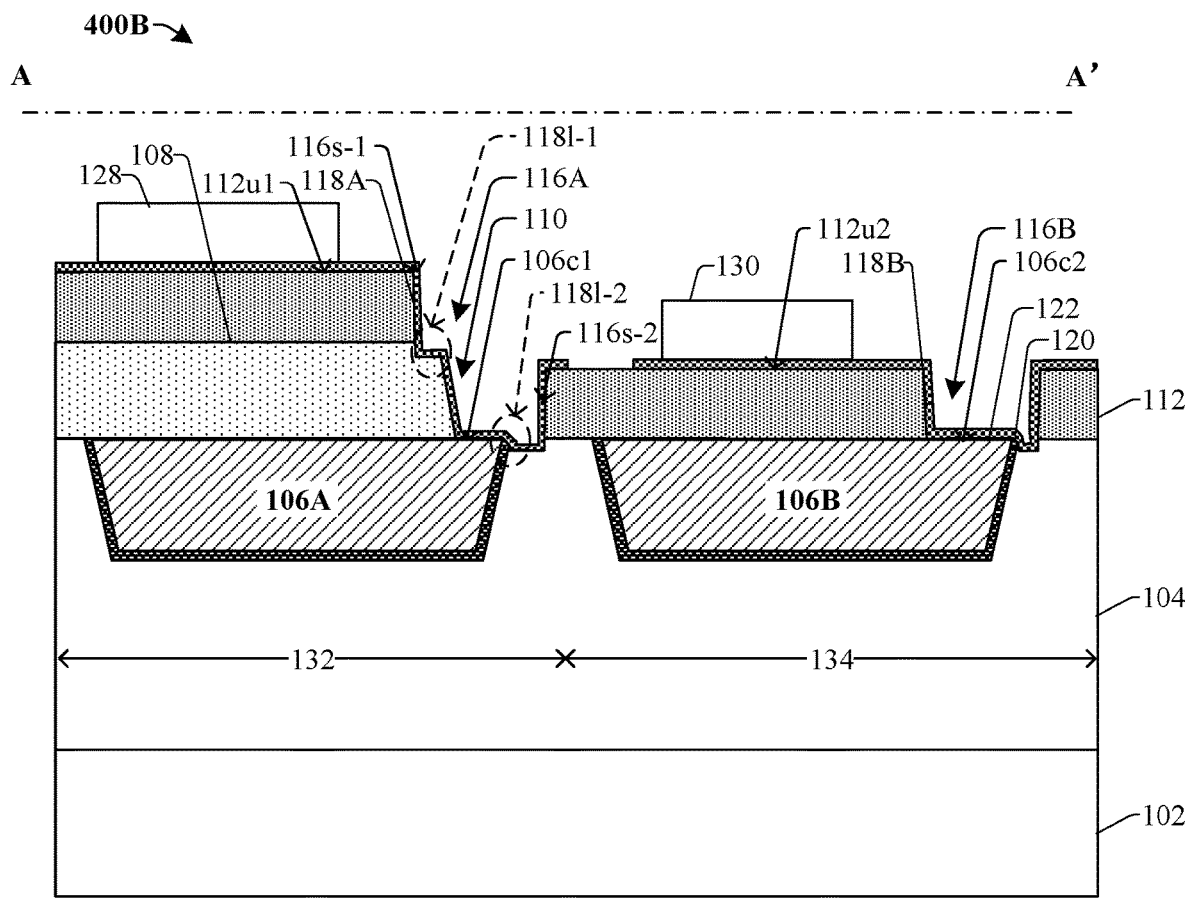

FIGS. 4A-4B illustrate a layout view 400A and a cross-sectional view 400B of some additional embodiments of an interconnect structure having a first via 118A disposed in a first region 132 and a second via 118B disposed in a second region 134. The first via 118A may be a staggered via disposed on a first contact region 106c1 of a first metal line 106A, and the second via 118B may be disposed on a second contact region 106c2 of a second metal line 106B. In some embodiments alternative to what is shown in FIG. 3A-3B, the first via 118A and the second via 118B may be respectively disposed at a corner region of the first metal line 106A and the second metal line 106B (as shown in FIGS. 4A-4B for example) or a boundary region of the first metal line 106A and the second metal line 106B (as shown in FIGS. 1A-1D for example).

In some embodiments, the first metal line 106A and the second metal line 106B each comprises a barrier layer 120 surrounding bottom and sidewall surfaces of a metal body 122. The first via 118A and the second via 118B each contacts the barrier layer 120 and the metal body 122. In some embodiments, the barrier layer 120 includes a material with less native oxide formation on top, and thus is easier to clean and provides better contact resistance for the first via 118A and the second via 118B. For example, the barrier layer 120 may comprise TaN, and the metal body may comprise AlCu. The native oxide of the barrier layer 120, TaO, is easier to be removed than alumina. Thus, interconnect reliability and contact resistance are improved by forming the first contact region 106c1 and the second contact region 106c2 at the corner regions of the first metal line 106A and the second metal line 106B contacting the barrier layer 120.

In some embodiments, as shown in FIGS. 4A-4B for example, the first dielectric layer 108 may be removed from one or multiple sides of the first via-hole 116A when patterning the first via-hole 116A. Thus, a first sidewall portion 116s-1 smoothly extends from the second dielectric layer 112 to the first dielectric layer 108. A second sidewall portion 116s-2 closer to the second region 134 may be lower than the first sidewall portion 116s-1. The first via 118A may comprise a first ledge 118l-1 lining an upper surface of the first dielectric layer 108. In some embodiments, the first via 118A further comprises a second ledge 118l-2 lining an upper surface of the barrier layer 120 and connecting a surface of the first metal line 106A and a recessed upper surface of the adjoining dielectric 104. Similarly, the second via 118B comprises a ledge lining an upper surface of the barrier layer 120 and connecting a surface of the second metal line 106B and a recessed upper surface of the adjoining dielectric 104.

FIGS. 5A-5B illustrate layout and cross-sectional views of some additional embodiments of an interconnect structure having multiple staggered vias with different heights. For example, the interconnect structure may have a first via 118A disposed in a first region 132 connecting a first metal line 106A, a second via 118B disposed in a second region 134 connecting a second metal line 106B, and a third via 118C disposed in a third region 136 connecting a third metal line 106C. The vias 118A, 118B, 118C are formed by a series of upper via-hole patterning processes. In some embodiments, the via-holes may have a square shape as shown, or another polygon or circle shape from the layout view as alternatives. The via-holes may have a lateral dimension shifted a constant value for the maximum use of layout areas while providing sufficient contact areas and ledges for easier via fillings. For example, a first dielectric layer 108 may be patterned directly above the first metal line 106A with a through-hole 110 disposed therethrough. A second dielectric layer 112 may be patterned directly above the first metal line 106A and the second metal line 106B with a first via-hole 116A and a second via-hole 116B disposed therethrough. A third dielectric layer 124 may be patterned directly above the first metal line 106A, the second metal line 106B, and the third metal line 106C with a first upper via-hole 126A, a second upper via-hole 126B, and a third upper via-hole 126C disposed therethrough.

Thus, the first via 118A may be a staggered via disposed along three concentric holes connected by ledges between one another: the first upper via-hole 126A extending from the third dielectric layer 124 to a first upper surface of the second dielectric layer 112, the first via-hole 116A extending from the second dielectric layer 112 to an upper surface of the first dielectric layer 108, and the through-hole 110 connected to the first via-hole 116A by the upper surface of the first dielectric layer 108. The second via 118B may be a staggered via disposed along two concentric holes: the second via-hole 116B and the second upper via-hole 126B, connected by a ledge on a second upper surface of the second dielectric layer 112. The second upper surface is lower than the first upper surface of the second dielectric layer 112. At last, the third via 118C is disposed along the third upper via-hole 126C reaching on the third metal line 106C.

Referring to FIG. 5A for the layout view, in some embodiments, the first upper via-hole 126A and the first via-hole 116A may be arranged concentric with the through-hole 110. In some embodiments, the second via-hole 116B may be arranged concentric with the second upper via-hole 126B. By setting the layout shapes and dimensions as discussed above, the maximum use of layout areas is achieved while providing sufficient contact areas and ledges for better via fillings.

Figure 6A:
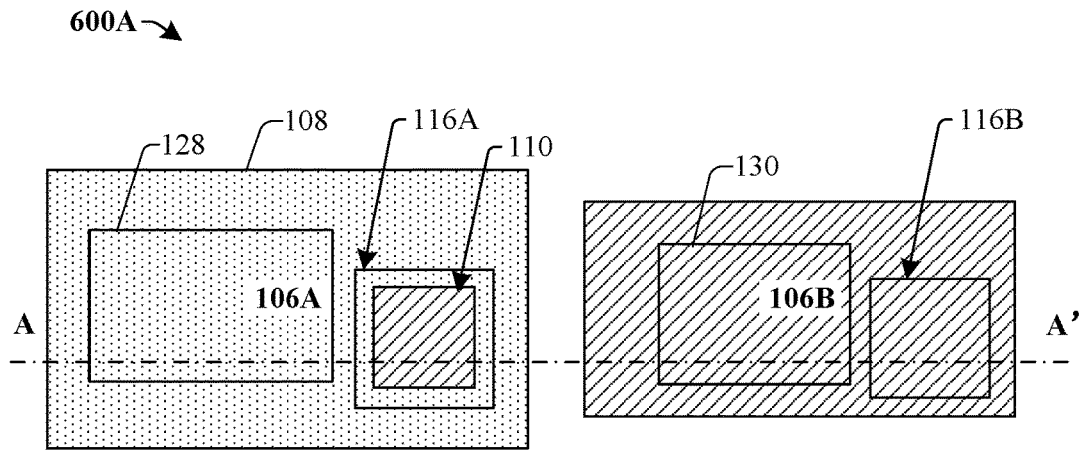
FIGS. 6A-6B illustrate layout and cross-sectional views of some additional embodiments of an interconnect structure having a staggered via and a second via of smaller height and aligned upper surface.
Figure 6B:
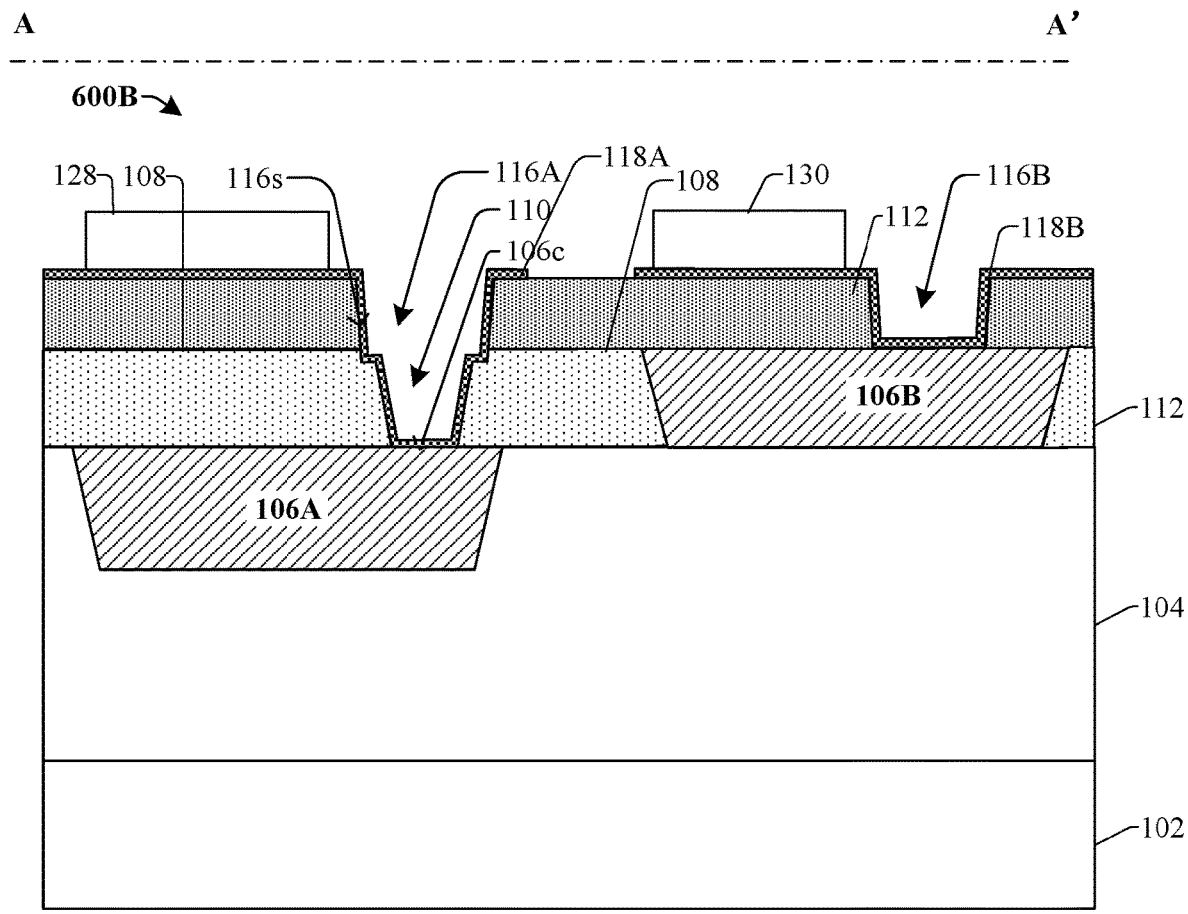

FIGS. 6A-6B illustrate layout and cross-sectional views of some additional embodiments of an interconnect structure having a staggered via and a second via of smaller height. Alternative to all discussed above, in some embodiments, the second metal line 106B may be disposed with an upper surface located above an upper surface of the first metal line 106A, and thus a smaller height between the second metal line 106B and the second dielectric layer 112 may exist even the first via 118A and the second via 118B have upper lateral portions aligned. The upper lateral portions of the first via 118A and the second via 118B may both be disposed on a planar upper surface of the second dielectric layer 112. Similarly as discussed above, the first via 118A and the second via 118B may be formed by forming the through-hole 110 when patterning the first dielectric layer 108 and then forming the first via-hole 116A and the second via-hole 116B together by patterning the second dielectric layer 112. Thus, no additional patterning process is needed for forming the first via 118A with a greater thickness than that of the second via 118B. In addition, the through-hole 110 and the first via-hole 116A may have a lateral dimension shift at the place of connecting, and thus forming a ledge therebetween. As a result, the step height for filling the first via 118A is reduced by having the staggered via shape, and thus reliability and contact resistance of the first via 118A can be improved.

FIGS. 7A-11B illustrate a series of layout and cross-sectional views of some embodiments of a method for forming an interconnect structure having a staggered via formed by a two-step process. Although FIGS. 7A-11B are described in relation to a method, it will be appreciated that the structures disclosed in FIGS. 7A-11B are not limited to such a method, but instead may stand alone as structures independent of the method.

As shown in the layout view 700A and cross-sectional view 700B of FIGS. 7A-7B, in some embodiments, a first metal line 106A and a second metal line 106B are provided. A first dielectric layer 108 is formed over the first metal line 106A and the second metal line 106B. A process for forming the first dielectric layer 108 may be or be comprised of depositing an oxide or other applicable dielectric layer by physical vapor deposition (PVD), chemical vapor deposition (CVD), atomic layer deposition (ALD), some other suitable deposition process, or any combination of the foregoing.

Figure 8A:
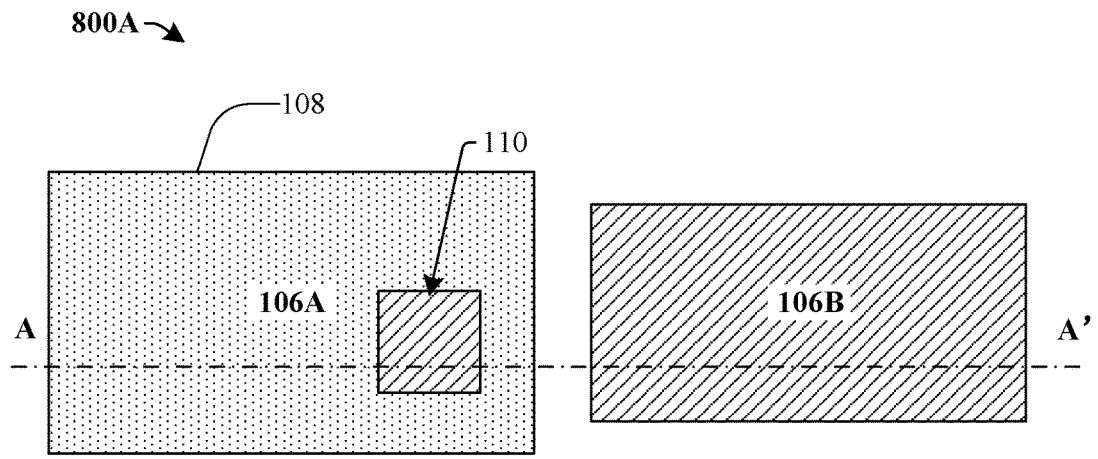
Figure 8B:
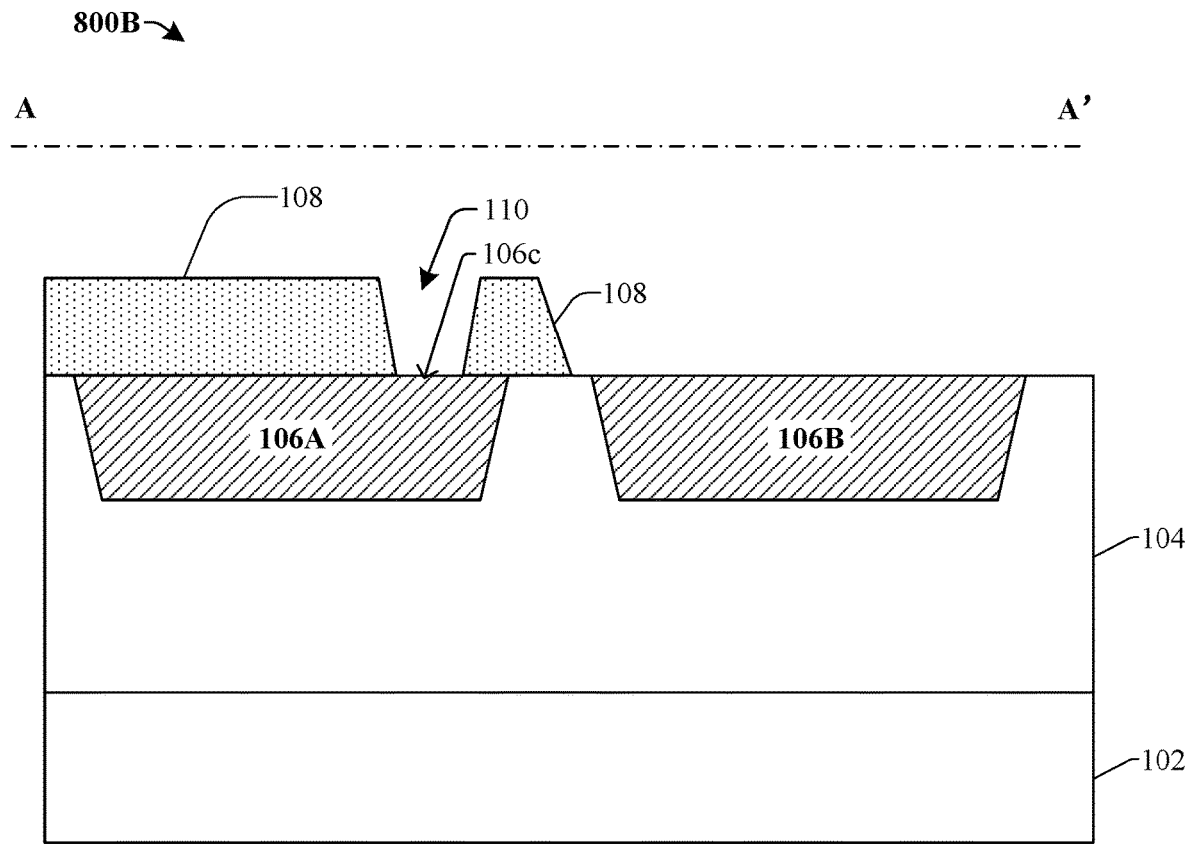

As shown in the layout view 800A and cross-sectional view 800B of FIGS. 8A-8B, in some embodiments, the first dielectric layer 108 is patterned to be removed from the second metal line 106B. The patterning may, for example, be performed by a photolithography/etching process and/or by some other suitable process. During the patterning, a through-hole 110 is formed exposing a first contact region of the first metal line 106A. In some embodiments, the through-hole 110 may have a square shape as shown, or another polygon or circle shape alternatively, from the layout view. The through-hole 110 may be arranged at one or more various locations above the first metal line 106A, such as a boundary region as shown in FIGS. 1A-1D. In some alternative embodiments, the through-hole 110 may be arranged at one or more of a central region, a corner region, or other applicable locations.

Figure 9A:
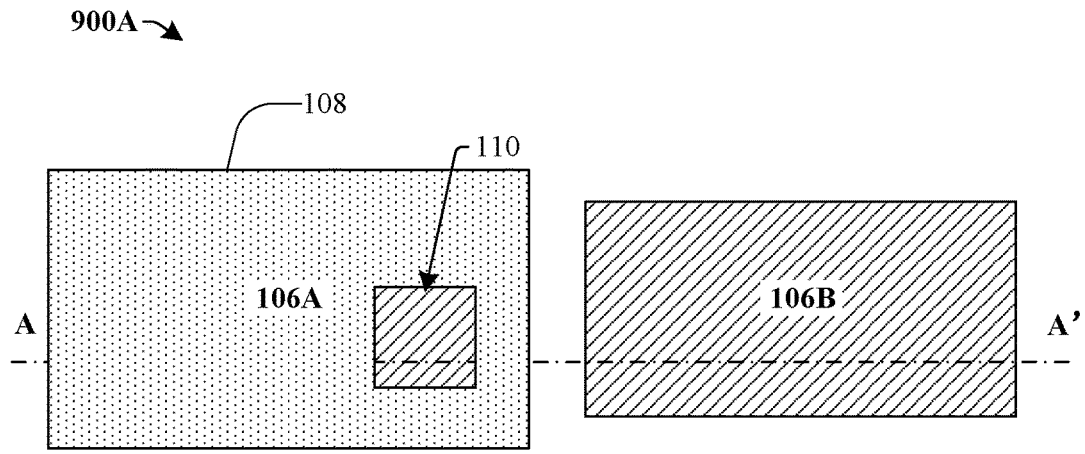
Figure 9B:
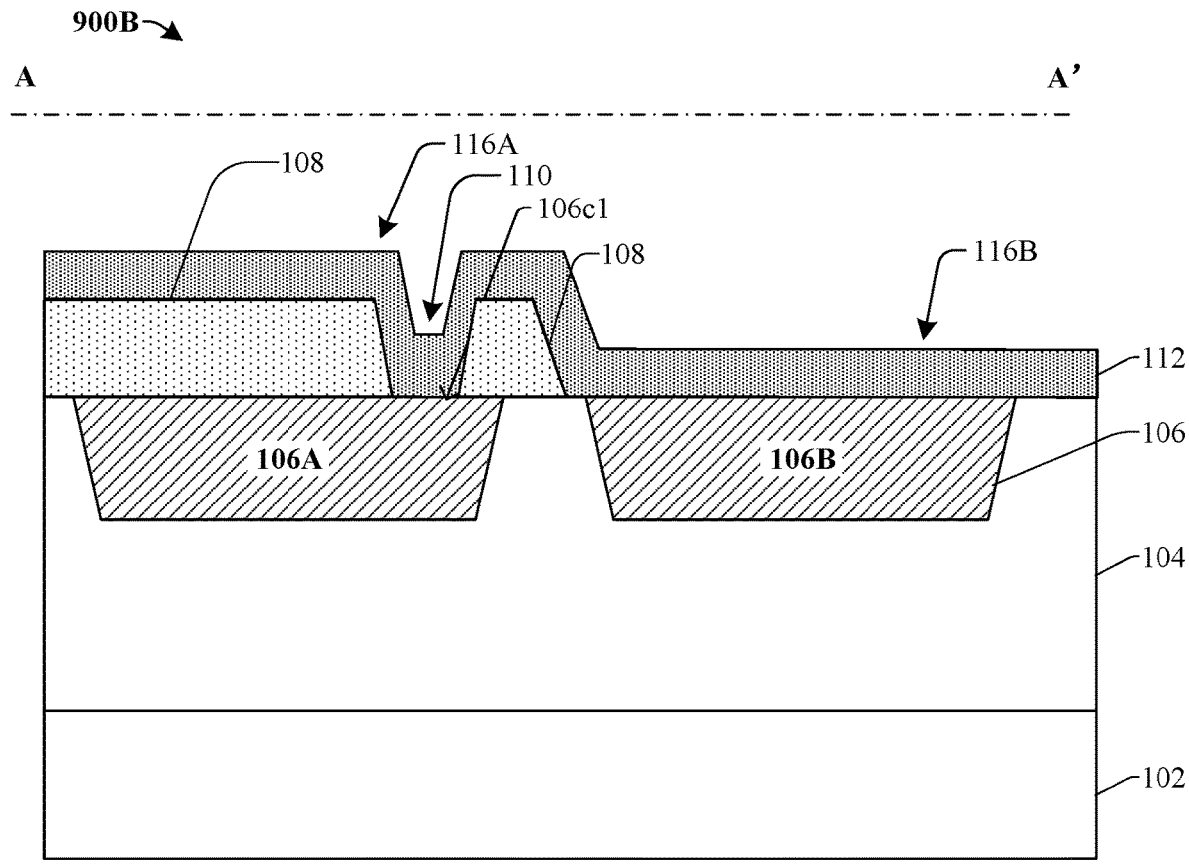

As shown in the layout view 900A and cross-sectional view 900B of FIGS. 9A-9B, in some embodiments, a second dielectric layer 112 is formed over the first dielectric layer 108 overlying the first metal line 106A and also overlying the second metal line 106B absenting the first dielectric layer 108. A process for forming the second dielectric layer 112 may be or be comprised of depositing an oxide or other applicable dielectric layer by PVD, CVD, ALD, some other suitable deposition process, or any combination of the foregoing. Thus, the first dielectric layer 108 and the second dielectric layer 112 collectively build a greater height directly above the first metal line 106A than a height directly above the second metal line 106B. The second dielectric layer 112 may extend into the through-hole 110 reaching the first contact region 106c1 of the first metal line 106A. In some embodiments, the second dielectric layer 112 may be deposited globally. In some alternative embodiments, the second dielectric layer 112 may also be patterned but still left to cover at least portions of the first dielectric layer 108 and the second dielectric layer 112.

Figure 10A:
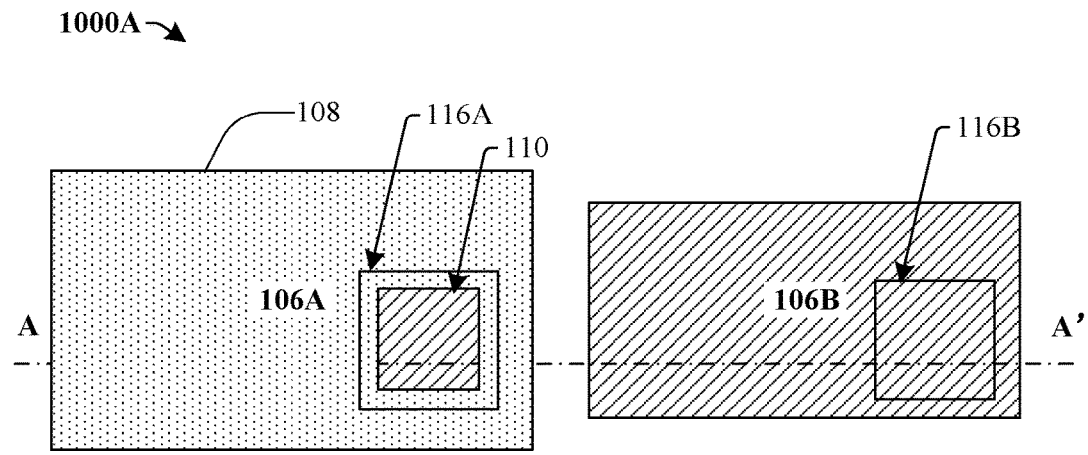
Figure 10B:
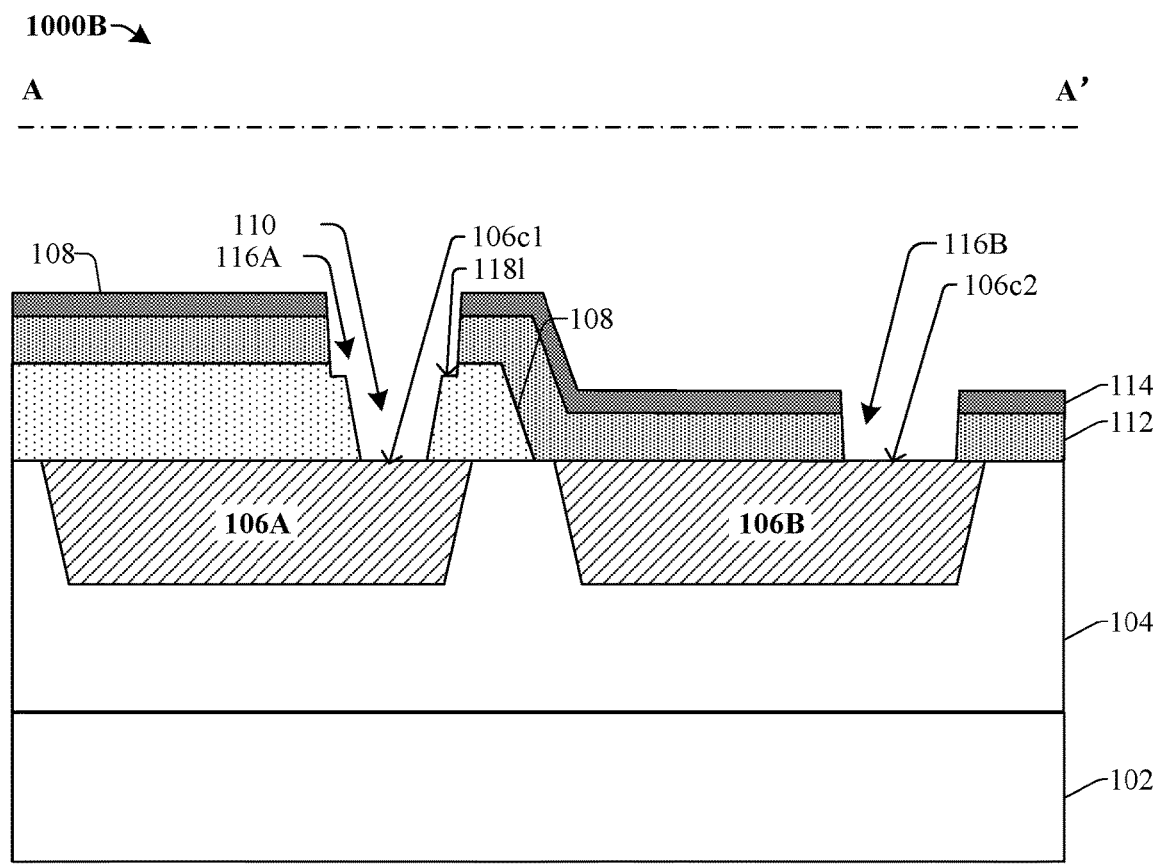

As shown in the layout view 1000A and cross-sectional view 1000B of FIGS. 10A-10B, in some embodiments, the second dielectric layer 112 is then patterned to concurrently form a first via-hole 116A directly above the lower through-hole 110 exposing a first contact region 106c1 of the first metal line 106A and a second via-hole 116B exposing a second contact region 106c2 of the second metal line 106B. The through-hole 110 and the first via-hole 116A collectively form a via-hole for a first via 118A (see FIGS. 11A-11B). The second via-hole is for a second via 118B (see FIGS. 11A-11B) with a depth smaller than the first via 118A. In some embodiments, the first via-hole 116A or the second via-hole 116B may have a square shape as shown in FIG. 10A, or another polygon or circle shape alternatively, from the layout view of FIG. 10A. The first via-hole 116A may be arranged concentric with the through-hole 110. In some embodiments, a bottom lateral dimension of the first via-hole 116A is greater than a top lateral dimension of the through-hole 110, and therefore results in a staggered shape with a ledge 1181 between the first via-hole 116A and the through-hole 110. In some embodiments, the second via-hole 116B may have a top or bottom lateral dimension, such as a diameter or a side length, that is between those of the first via-hole 116A and the through-hole 110.

In some embodiments, a hard mask layer 114 may be formed on the second dielectric layer 112 and used as a mask for patterning the second dielectric layer 112 accordingly. The hard mask layer 114 may be formed by one or more deposition or spin-on processes of various polymer, dielectric, and/or metal materials. The hard mask layer 114 may comprise TiN for example. Though the hard mask layer 114 is shown in some figures (e.g., FIGS. 10A-11B, 14A-15B) and not shown in other figures (e.g., FIGS. 1A-6B), it is appreciated that the hard mask layer 114 may be used or omitted for various embodiments and may or may not be left in the final device above the second dielectric layer 112.

Figure 11A:
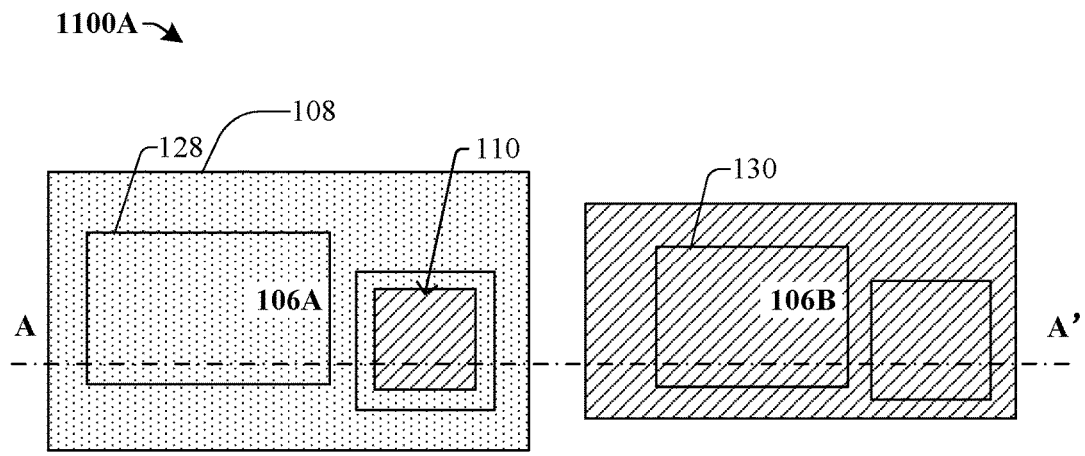
Figure 11B:
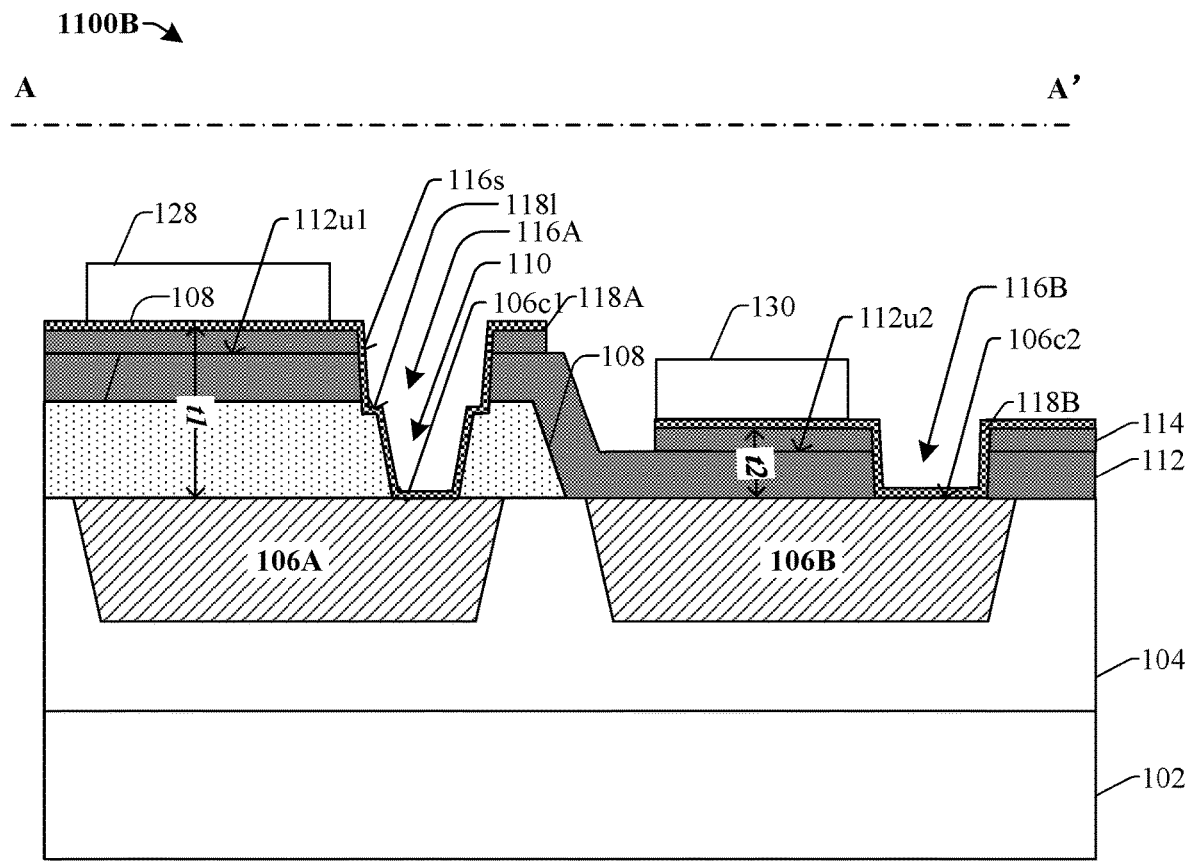

As shown in the layout view 1100A and cross-sectional view 1100B of FIGS. 11A-11B, in some embodiments, the first via 118A and the second via 118B are respectively formed within the first via-hole 116A and the through-hole 110 and the second via-hole 116B. In some embodiments, a pre-clean process is performed to prepare the first contact region 106c1 and the second contact region 106c2. For example, an ion bombardment process such as an Ar bombardment process may be performed to remove native oxide (ex. Al2O3). Then, a conductive feature is formed along the first via-hole 116A, the through-hole 110, and the second via-hole 116B and extended along a first upper surface 112u1 of the second dielectric layer 112 and a second upper surface 112u2 of the second dielectric layer 112 lower than the first upper surface 112u1. For example, the conductive feature may be formed conformally and by DC sputtering, PVD, CVD, ALD, some other suitable deposition process, or any combination of the foregoing. As an example, the conductive feature may be formed with a thickness in a range of 10 nm to 50 nm, in order to balance a low wire resistance and reliable electrical connection with the process cost.

The conductive feature is then patterned to form the first via 118A with a first lateral portion extending along the first upper surface 112u1 and the second via 118B with a second lateral portion extending along the second upper surface 112u2. The hard mask layer 114 can be patterned together with the conductive feature. In this case, the hard mask layer 114 may have sidewalls vertically aligned with those of the first via 118A and the second via 118B. In some embodiments, the hard mask layer 114 may comprise the same metal material as the conductive feature and thus may merge as a seamless integral with the first via 118A and the second via 118B in the final device. A first device 128 may be formed on the first lateral portion of the first via 118A and electrically connected to the first metal line 106A. Similarly, a second device 130 may be formed on the second lateral portion of the second via 118B and electrically connected to the second metal line 106B. As an example, control signals may be provided from a logic circuit within the substrate 102 to the first device 128 and the second device 130 respectively through the first metal line 106A and the second metal line 106B. A first distance from a bottom surface of the first device 128 to the first metal line 106A is greater than a second distance from a bottom surface of the second device 130 to the second metal line 106B, and thus may provide cavities of different lengths t1, t2, respectively between the first metal line 106A and the first device 128 and the second metal line 106B and the second device 130.

FIGS. 12A-15B illustrate a series of layout and cross-sectional views of some embodiments of a method for forming an interconnect structure having a staggered via formed by a two-step process at a corner or boundary region. Although FIGS. 12A-15B are described in relation to a method, it will be appreciated that the structures disclosed in FIGS. 12A-15B are not limited to such a method, but instead may stand alone as structures independent of the method.

Figure 12A:
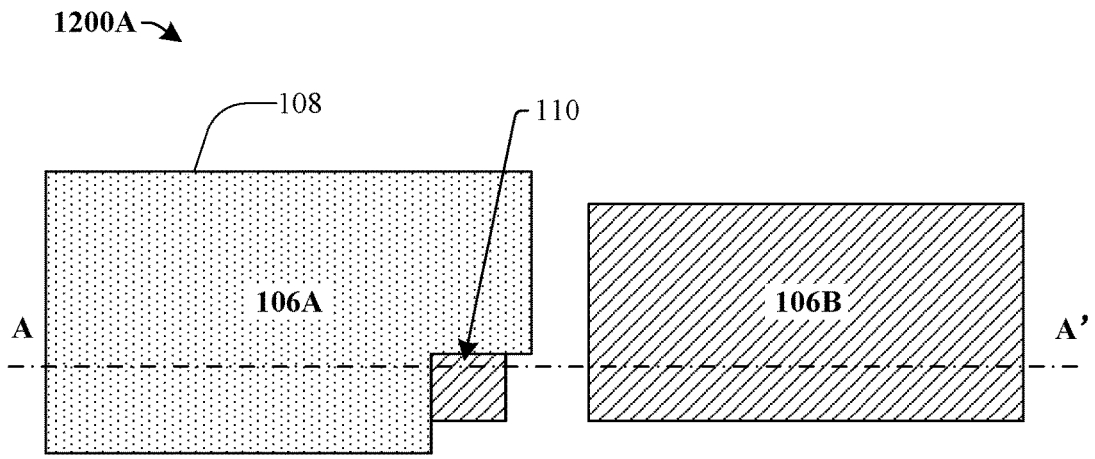
FIGS. 12A-15B illustrate a series of layout and cross-sectional views of some embodiments of a method for forming an interconnect structure having a staggered via formed by a two-step process at a corner region of a metal line.
Figure 12B:
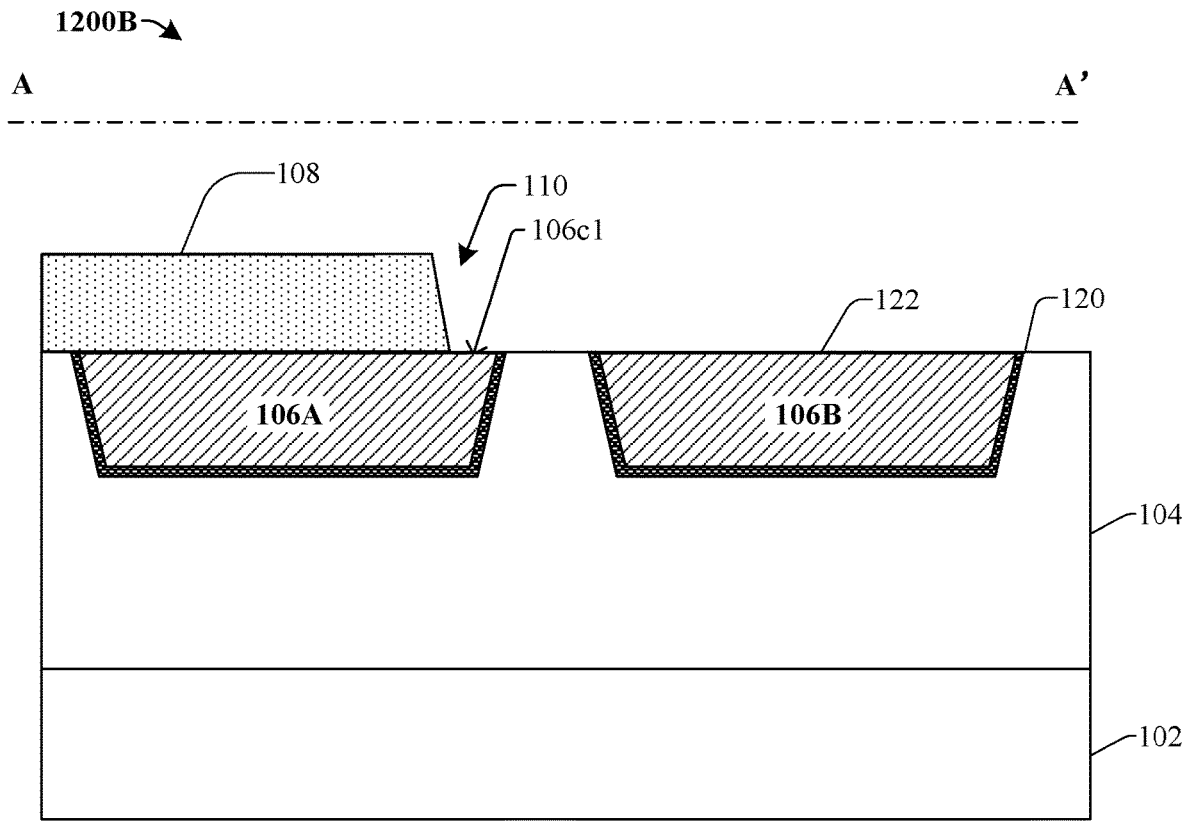

As shown in the layout view 1200A and cross-sectional view 1200B of FIGS. 12A-12B, in some embodiments, a first dielectric layer 108 is formed on a first metal line 106A with a through-hole 110 exposing a first contact region 106c1 of the first metal line 106A. In some embodiments, a process for forming the first dielectric layer 108 may comprise depositing an oxide or other applicable dielectric layer by physical vapor deposition (PVD), chemical vapor deposition (CVD), atomic layer deposition (ALD), some other suitable deposition process, or any combination of the foregoing. Then, the first dielectric layer 108 is patterned to be removed from the second metal line 106B and the first contact region 106c1 of the first metal line 106A. The patterning may, for example, be performed by a photolithography/etching process and/or by some other suitable process. In some embodiments, the through-hole 110 may have a square shape as shown, or another polygon or circle shape alternatively, from the layout view. The through-hole 110 may be arranged at one or more various locations above the first metal line 106A, such as a corner region with one or more sides of interfaces of the first and second metal lines 106A, 106B and adjoining dielectric 104 exposed. In some embodiments, the first metal line 106A and the second metal line 106B each comprises a barrier layer 120 surrounding bottom and sidewall surfaces of a metal body 122. The through-hole 110 exposes the barrier layer 120 and the metal body 122. As an example, the barrier layer 120 may comprise TaN, and the metal body may comprise AlCu.

Figure 13A:
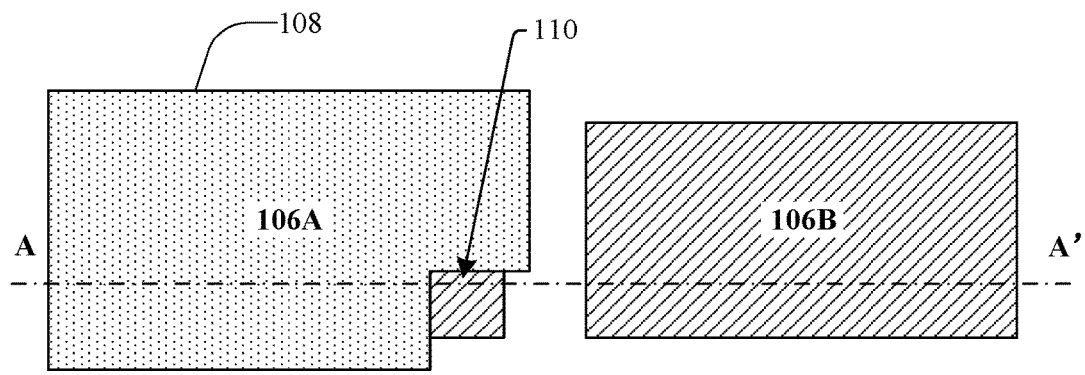
Figure 13B:
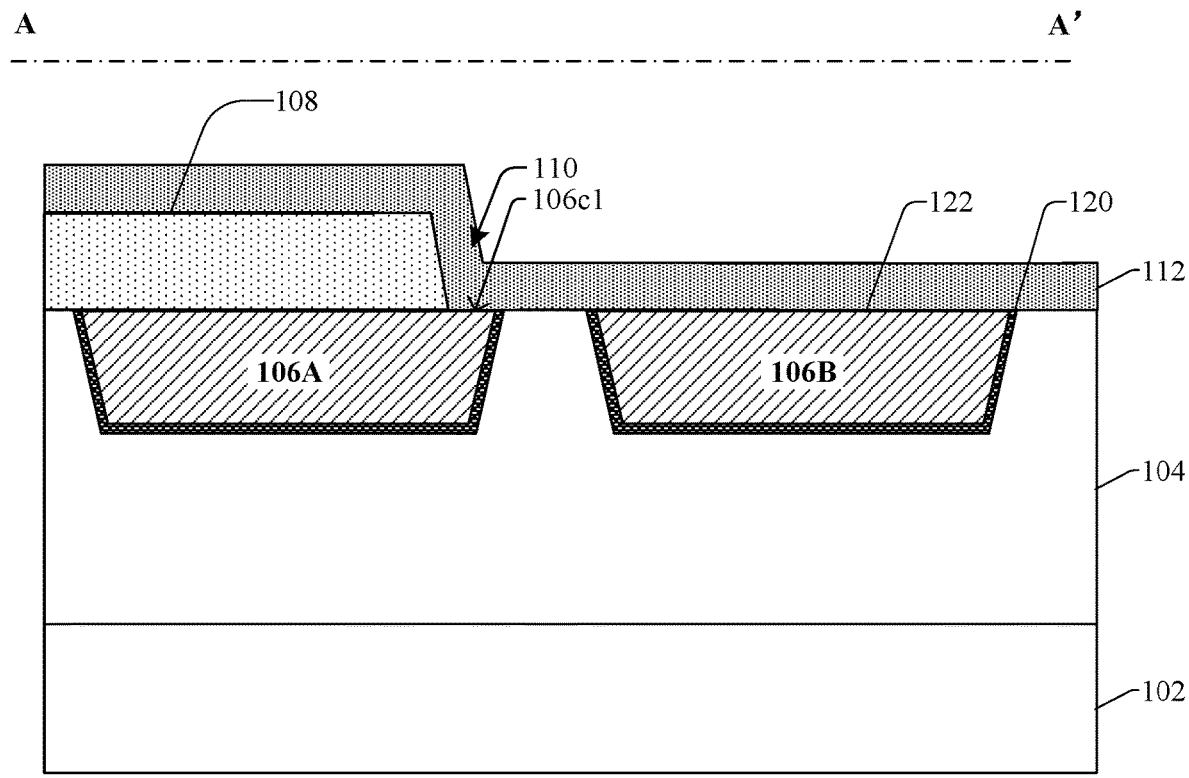

As shown in the layout view 1300A and cross-sectional view 1300B of FIGS. 13A-13B, in some embodiments, a second dielectric layer 112 is formed over the first dielectric layer 108 overlying the first metal line 106A and also overlying the second metal line 106B absenting the first dielectric layer 108. A process for forming the second dielectric layer 112 may be or be comprised of depositing an oxide or other applicable dielectric layer by PVD, CVD, ALD, some other suitable deposition process, or any combination of the foregoing. Thus, the first dielectric layer 108 and the second dielectric layer 112 collectively build a greater height directly above the first metal line 106A than a height directly above the second metal line 106B. The second dielectric layer 112 may extend onto portions of the barrier layer 120 and the metal body 122 within the through-hole 110. In some embodiments, the second dielectric layer 112 may be deposited globally. In some alternative embodiments, the second dielectric layer 112 may also be patterned but still left to cover at least portions of the first dielectric layer 108 and the second dielectric layer 112.

Figure 14A:
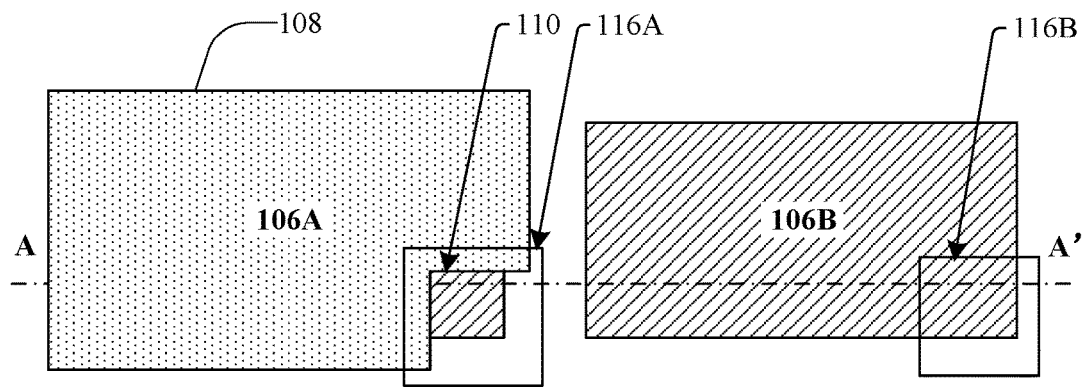
Figure 14B:
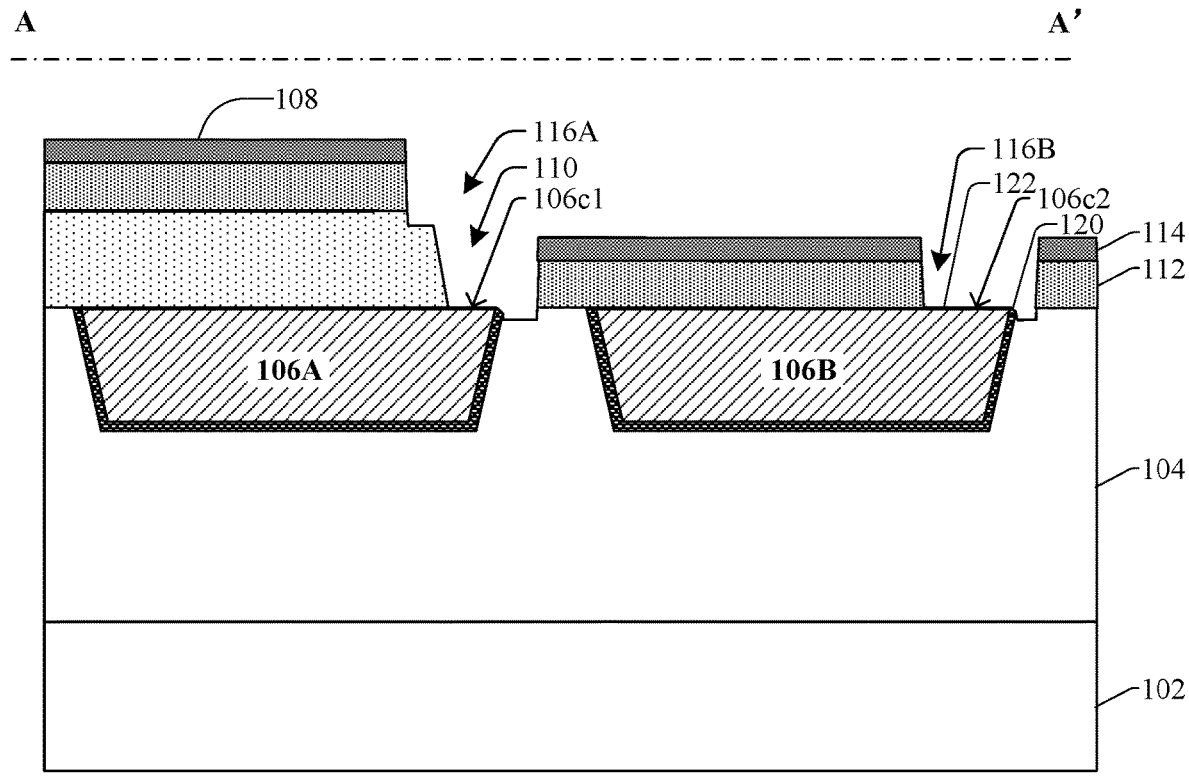

As shown in the layout view 1400A and cross-sectional view 1400B of FIGS. 14A-14B, in some embodiments, the second dielectric layer 112 is then patterned to concurrently form a first via-hole 116A directly above the lower through-hole 110 exposing a first contact region 106c1 of the first metal line 106A and a second via-hole 116B exposing a second contact region 106c2 of the second metal line 106B. The through-hole 110 and the first via-hole 116A collectively form a via-hole for a first via 118A (see FIGS. 15A-15B). In some embodiments, the second dielectric layer 112 is completely removed from a sidewall of the first dielectric layer 108 as shown in the figure. In some alternative embodiments, the second dielectric layer 112 may have a left over portion disposed on the sidewall of the first dielectric layer 108. The second via-hole is for a second via 118B (see FIGS. 15A-15B) with a depth smaller than the first via 118A. In some embodiments, the first via-hole 116A or the second via-hole 116B may have a square shape as shown in FIG. 14A, or another polygon or circle shape alternatively, from the layout view of FIG. 14A. The first via-hole 116A may be arranged concentric with the through-hole 110. In some embodiments, a bottom lateral dimension of the first via-hole 116A is greater than a top lateral dimension of the through-hole 110, and therefore results in a staggered shape with a ledge between the first via-hole 116A and the through-hole 110 (more details discussed with reference to FIGS. 15A-15B below). In some embodiments, the second via-hole 116B may have a top or bottom lateral dimension, such as a diameter or a side length, that is between those of the first via-hole 116A and the through-hole 110.

Figure 15A:
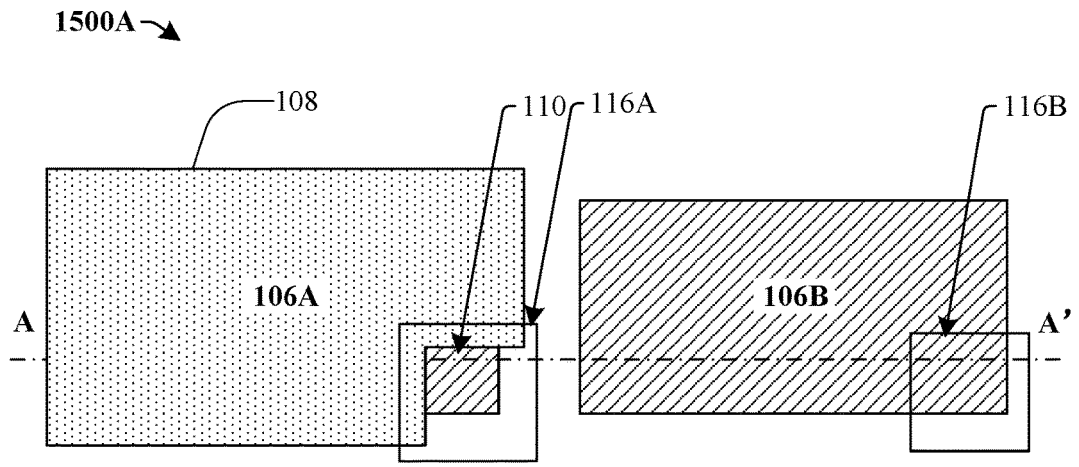
Figure 15B:
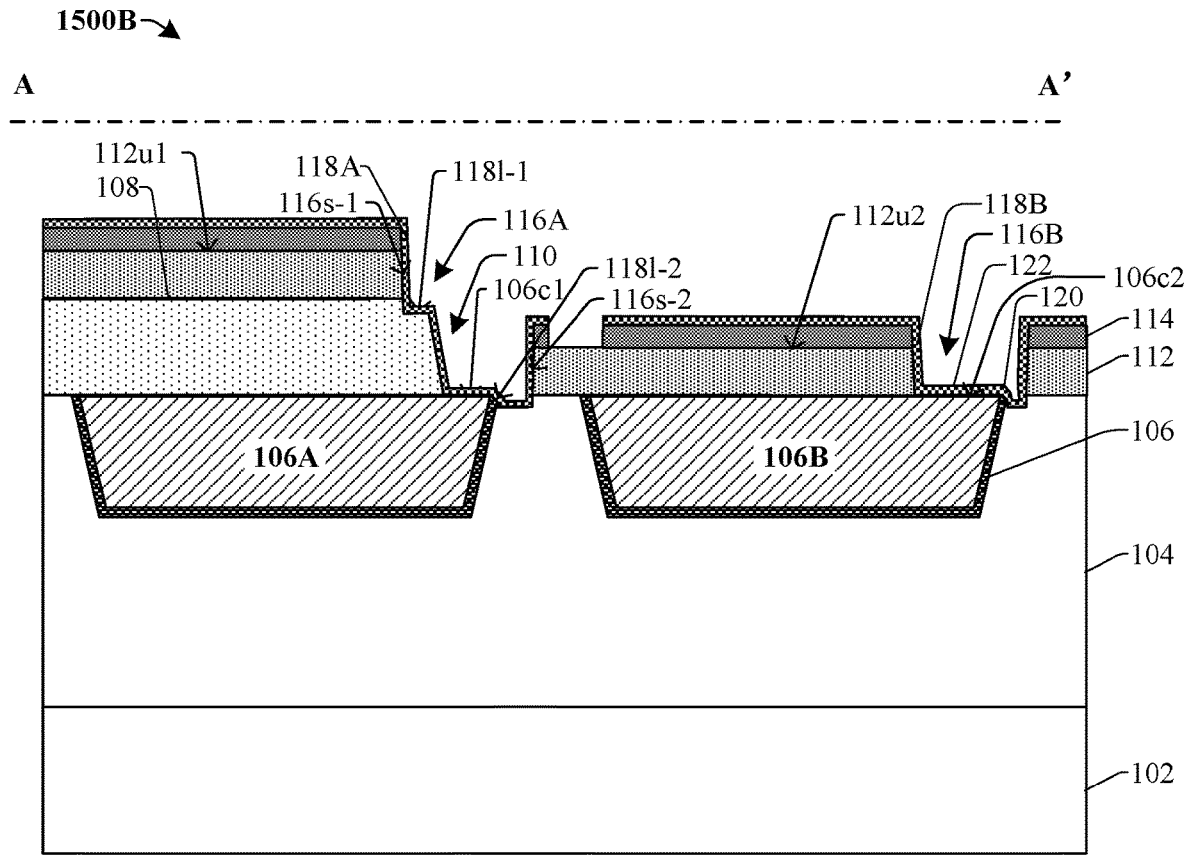

As shown in the layout view 1500A and cross-sectional view 1500B of FIGS. 15A-15B, in some embodiments, the first via 118A and the second via 118B are respectively formed within the first via-hole 116A and the through-hole 110 and the second via-hole 116B. In some embodiments, a pre-clean process is performed to prepare the first contact region 106c1 and the second contact region 106c2. For example, an ion bombardment process such as an Ar bombardment process may be performed to remove native oxide (ex. TaO, Al2O3). By using a layout design of the first via 118A and the second via 118B at corners of the metal lines 106A, 106B, the barrier layer 120 is at least portions of the contact regions 106c1, 106c2. The barrier layer 120 may have a native oxide softer to etch than that of the metal body 122. Thus, the pre-clean process takes less time and can be finished more completely, such that interconnect reliability and contact resistance are improved.

Then, a conductive feature is formed along the first via-hole 116A, the through-hole 110, and the second via-hole 116B and extended along a first upper surface 112u1 of the second dielectric layer 112 and a second upper surface 112u2 of the second dielectric layer 112 lower than the first upper surface 112u1. For example, the conductive feature may be formed conformally and by DC sputtering, PVD, CVD, ALD, some other suitable deposition process, or any combination of the foregoing. As an example, the conductive feature may be formed with a thickness in a range of 10 nm to 50 nm, in order to balance a low wire resistance and reliable electrical connection with the process cost.

The conductive feature is then patterned to form the first via 118A with a first lateral portion extending along the first upper surface 112u1 and the second via 118B with a second lateral portion extending along the second upper surface 112u2. In some embodiments, a first sidewall portion 116s-1 smoothly extends from the second dielectric layer 112 to the first dielectric layer 108. A second sidewall portion 116s-2 closer to the second region 134 may be lower than the first sidewall portion 116s-1. The first via 118A may comprise a first ledge 118l-1 lining an upper surface of the first dielectric layer 108. In some embodiments, the first via 118A further comprises a second ledge 118l-2 lining an upper surface of the barrier layer 120 and connecting a surface of the first metal line 106A and a recessed upper surface of the adjoining dielectric 104. Similarly, the second via 118B comprises a ledge lining an upper surface of the barrier layer 120 and connecting a surface of the second metal line 106B and a recessed upper surface of the adjoining dielectric 104. The hard mask layer 114 can be patterned together with the conductive feature. In this case, the hard mask layer 114 may have sidewalls vertically aligned with those of the first via 118A and the second via 118B. In some embodiments, the hard mask layer 114 may comprise the same metal material as the conductive feature and thus may merge as a seamless integral with the first via 118A and the second via 118B in the final device.

Therefore, the present disclosure relates to a new method of forming an interconnect structure that eliminates a separate deep via patterning process to simplify the fabrication process. A staggered via is therefore formed to provide for improved connection reliability and contact resistance.

Accordingly, in some embodiments, the present disclosure relates to a method of forming an interconnect structure for a semiconductor device. The method comprises depositing a first dielectric layer over a first metal line and a second metal line overlying a substrate and patterning the first dielectric layer to be removed from the second metal line and to form a through-hole exposing a first contact region of the first metal line. The method further comprises depositing a second dielectric layer over both the first metal line and the second metal line, where the second dielectric layer extending into the through-hole reaching the first contact region of the first metal line and over the second metal line. The method further comprises patterning the second dielectric layer to form a first via-hole connecting to the through-hole vertically and concentric with the through-hole from a layout view. The first via-hole and the through-hole expose the first contact region of the first metal line, and a second via-hole exposes a second contact region of the second metal line. The method further comprises forming a first via on the first contact region extending along the through-hole, the first via-hole, and a first upper surface of the second dielectric layer, and a second via on the second contact region extending along the second via-hole and a second upper surface of the second dielectric layer.

In other embodiments, the present disclosure relates to a method of forming an interconnect structure for a semiconductor device. The method comprises forming a first metal line and a second metal line over a substrate and forming a first dielectric layer over the first metal line and absent from the second metal line. A through-hole is patterned within the first dielectric layer to expose a first contact region of the first metal line. The method further comprises forming a second dielectric layer over both the first metal line and the second metal line. A first via-hole is patterned through the second dielectric layer to be connected to the through-hole and exposes the first contact region of the first metal line. A second via-hole is concurrently patterned through the second dielectric layer with the second via-hole exposing a second contact region of the second metal line. The method further comprises forming a first via on the first contact region extending along the through-hole, the first via-hole, and a first upper surface of the second dielectric layer, and forming a second via on the second contact region extending along the second via-hole and a second upper surface of the second dielectric layer. The first upper surface is higher than the second upper surface.

In yet other embodiments, the present disclosure relates to an interconnect structure for a semiconductor device. The interconnect structure comprises a first metal line and a second metal line surrounded by an adjoining dielectric and disposed over a substrate. A first dielectric layer is disposed over the first metal line with a through-hole extending through the first dielectric layer and overlies a first contact region of the first metal line. A second dielectric layer is disposed over the first dielectric layer and the first and second metal lines with a first via-hole and a second via-hole extending through the second dielectric layer. The first via-hole connects to the through-hole and overlies the first contact region. The second via-hole overlies a second contact region of the second metal line. A first via is disposed on the first contact region and extending along the through-hole, the first via-hole, and a first upper surface of the second dielectric layer. A second via is disposed on the second contact region and extending along the second via-hole and a second upper surface of the second dielectric layer. The first via comprises a first ledge lining an upper surface of the first dielectric layer and connecting sidewalls of the first dielectric layer and the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of forming an interconnect structure for a semiconductor device, comprising:
depositing a first dielectric layer over a first metal line and a second metal line overlying a substrate;
patterning the first dielectric layer to be removed from the second metal line and to form a through-hole exposing a first contact region of the first metal line;
depositing a second dielectric layer over both the first metal line and the second metal line, the second dielectric layer extending into the through-hole reaching the first contact region of the first metal line and over the second metal line;
patterning the second dielectric layer to form a first via-hole connecting to the through-hole vertically and concentric with the through-hole from a layout view, the first via-hole and the through-hole exposing the first contact region of the first metal line and a second via-hole exposing a second contact region of the second metal line; and
forming a first via on the first contact region extending along the through-hole, the first via-hole, and a first upper surface of the second dielectric layer, and a second via on the second contact region extending along the second via-hole and a second upper surface of the second dielectric layer.

2. The method of claim 1, wherein the first via-hole is formed with a bottom lateral dimension greater than a top lateral dimension of the through-hole, and a first ledge is formed between the first via-hole and the through-hole.

3. The method of claim 1, wherein the second via-hole is formed with a top lateral dimension between those of the first via-hole and the through-hole.

4. The method of claim 1, further comprising forming a hard mask layer after depositing a second dielectric layer, wherein the second dielectric layer is patterned according to the hard mask layer.

5. The method of claim 1, wherein the first via-hole is formed with the entire sidewall smoothly extending from the second dielectric layer to an upper portion of the first dielectric layer.

6. The method of claim 1, wherein the through-hole and the first via-hole are formed directly overlying a corner region of the first metal line.

7. The method of claim 6, wherein the first via contacts a barrier layer and a metal body of the first metal line, and wherein the second via contacts a barrier layer and a metal body of the second metal line.

8. The method of claim 7, wherein the first via-hole is formed with a first sidewall portion smoothly extending from the second dielectric layer to the first dielectric layer and a second sidewall portion lower than the first sidewall portion.

9. The method of claim 7, wherein the second via-hole is formed directly overlying a corner region of the second metal line, and the second via contacts a barrier layer and a metal body of the second metal line.

10. The method of claim 1, further comprising forming a first device on the first upper surface with a first vertical distance to the first metal line and a second device on the second upper surface with a second vertical distance to the second metal line, wherein the first vertical distance is greater than the second vertical distance.

11. A method of forming an interconnect structure for a semiconductor device, comprising:
    forming a first metal line and a second metal line over a substrate;
    forming a first dielectric layer over the first metal line and absent from the second metal line, wherein a through-hole is patterned within the first dielectric layer to expose a first contact region of the first metal line;
    forming a second dielectric layer over both the first metal line and the second metal line, wherein a first via-hole is patterned through the second dielectric layer to be connected to the through-hole and exposing the first contact region of the first metal line, and wherein a second via-hole is concurrently patterned through the second dielectric layer with the second via-hole exposing a second contact region of the second metal line; and
    forming a first via on the first contact region extending along the through-hole, the first via-hole, and a first upper surface of the second dielectric layer, and forming a second via on the second contact region extending along the second via-hole and a second upper surface of the second dielectric layer, wherein the first upper surface is higher than the second upper surface.

12. The method of claim 11, wherein the first via is formed with a first ledge lining an upper surface of the first dielectric layer and connecting sidewalls of the first dielectric layer and the second dielectric layer.

13. The method of claim 12, wherein the through-hole is formed directly overlying a corner region of the first metal line, and wherein the first via-hole exposes the first metal line and an adjoining dielectric.

14. The method of claim 13, wherein the first metal line and the second metal line are formed with a barrier layer surrounding bottom and sidewall surfaces of a metal body, and wherein the first via and the second via contact the barrier layer and the metal body.

15. The method of claim 14, wherein the first via is formed with a second ledge lining an upper surface of the barrier layer and connecting surfaces of the first metal line and the adjoining dielectric.

16. A method, comprising:
    depositing a first dielectric layer on a first metal line;
    patterning the first dielectric layer to form a through-hole that overlies a first contact region of the first metal line;
    depositing a second dielectric layer on the first dielectric layer, the first metal line, and a second metal line in lateral with the first metal line;
    patterning the second dielectric layer to form a first via-hole and a second via-hole extending through the second dielectric layer, the first via-hole connecting to the through-hole and overlying the first contact region, and the second via-hole overlying a second contact region of the second metal line; and
    depositing a conductive layer to form a first conductive via on the first contact region and a second conductive via on the second contact region,
    wherein the conductive layer is formed extending along the through-hole, the first via-hole, and a first upper surface of the second dielectric layer, and lining an upper surface of the first dielectric layer that connects sidewalls of the first dielectric layer and the second dielectric layer, and
    wherein the conductive layer is formed extending along the second via-hole and a second upper surface of the second dielectric layer.

17. The method of claim 16, wherein the patterning of the second dielectric layer exposes the upper surface of the first dielectric layer.

18. The method of claim 16, wherein the patterning of the second dielectric layer forms the second via-hole with a square shape from a layout view and exposes the second upper surface of the second dielectric layer.

19. The method of claim 16, wherein the patterning of the first dielectric layer exposes a barrier layer of the first metal line and the second metal line.

20. The method of claim 19, wherein the patterning of the second dielectric layer exposes the whole area of the barrier layer exposed by the patterning of the first dielectric layer.

* * * * *